(12) United States Patent
Seshadri et al.

(10) Patent No.: US 8,017,241 B2
(45) Date of Patent: Sep. 13, 2011

(54) SULFONATION OF CONDUCTING POLYMERS AND OLED, PHOTOVOLTAIC, AND ESD DEVICES

(75) Inventors: Venkataramanan Seshadri, Monroeville, PA (US); Brian E. Woodworth, Pittsburgh, PA (US); Christopher Greco, Wexford, PA (US); Darin Laird, Pittsburgh, PA (US); Mathew K. Mathai, Monroeville, PA (US)

(73) Assignee: Plextronics, Inc., Pittsburgh, PA (US)

( * ) Notice: Subject to any disclaimer, the term of this patent is extended or adjusted under 35 U.S.C. 154(b) by 1007 days.

(21) Appl. No.: 11/826,394

(22) Filed: Jul. 13, 2007

(65) Prior Publication Data

US 2008/0248313 A1    Oct. 9, 2008

Related U.S. Application Data

(60) Provisional application No. 60/832,095, filed on Jul. 21, 2006, provisional application No. 60/845,172, filed on Sep. 18, 2006.

(51) Int. Cl.
*B32B 15/08* (2006.01)
*B32B 27/00* (2006.01)
*B32B 33/00* (2006.01)
*H01B 1/12* (2006.01)

(52) U.S. Cl. .............. 428/411.1; 428/457; 252/500; 524/505

(58) Field of Classification Search .......... None
See application file for complete search history.

(56) References Cited

U.S. PATENT DOCUMENTS

| | | | |
|---|---|---|---|
| 4,356,429 A | 10/1982 | Tang | |
| 4,387,187 A | 6/1983 | Newton | |
| 4,415,706 A | 11/1983 | Staas | |
| 4,485,031 A | 11/1984 | Olstowski et al. | |
| 4,508,639 A * | 4/1985 | Camps et al. | 252/500 |
| 4,539,507 A | 9/1985 | VanSlyke et al. | |
| 4,737,557 A | 4/1988 | Sato et al. | |
| 4,898,912 A | 2/1990 | Siol et al. | |
| 4,909,959 A | 3/1990 | Lemaire et al. | |
| 4,929,388 A | 5/1990 | Wessling et al. | |
| 4,935,164 A | 6/1990 | Wessling et al. | |
| 4,959,430 A | 9/1990 | Jonas et al. | |

(Continued)

FOREIGN PATENT DOCUMENTS

EP    0 253 594 A2    1/1988

(Continued)

OTHER PUBLICATIONS

Yamamoto, T., "p-Doping of poly(3-hexylthiophene-2,5-diyl) with sulfonic acids and oxygen related to self-doping of sulfonated polythiophenes," Reactive & Functional Polymers, vol. 55, pp. 231-234 (2003).

(Continued)

*Primary Examiner* — Ramsey Zacharia
(74) *Attorney, Agent, or Firm* — Foley & Lardner LLP

(57) ABSTRACT

Conducting polymer systems for hole injection or transport layer applications including a composition comprising: a water soluble or water dispersible regioregular polythiophene comprising (i) at least one organic substituent, and (ii) at least one sulfonate substituent comprising sulfonate sulfur bonding directly to the polythiophene backbone. The polythiophene can be water soluble, water dispersible, or water swellable. They can be self-doped. The organic substituent can be an alkoxy substituent, or an alkyl substituent. OLED, PLED, SMOLED, PV, and ESD applications can be used.

102 Claims, 24 Drawing Sheets

M = metal ion, ammonium ion (also alkyl, aryl substituted), phosphonium ion (also alkyl, aryl substituted), imidazolinium, thiazolinium, oxazolinium y/x = 0-1; x/n = 0-1

U.S. PATENT DOCUMENTS

| | | | |
|---|---|---|---|
| 4,990,557 A | 2/1991 | Lee | |
| 4,992,559 A | 2/1991 | Kathirgamanathan et al. | |
| 5,047,687 A | 9/1991 | VanSlyke et al. | |
| 5,137,991 A | 8/1992 | Epstein et al. | |
| 5,204,424 A * | 4/1993 | Roncali et al. | 252/500 |
| 5,247,190 A | 9/1993 | Friend et al. | |
| 5,401,827 A | 3/1995 | Holmes et al. | |
| 5,454,880 A | 10/1995 | Sariftci et al. | |
| 5,486,560 A | 1/1996 | Shiga et al. | |
| 5,548,060 A | 8/1996 | Allcock et al. | |
| 5,648,453 A | 7/1997 | Saida et al. | |
| 5,993,694 A | 11/1999 | Ito et al. | |
| 6,166,172 A | 12/2000 | McCullough et al. | |
| 6,365,294 B1 | 4/2002 | Pintauro et al. | |
| 6,602,974 B1 | 8/2003 | McCullough et al. | |
| 6,682,175 B2 | 1/2004 | Otsuka | |
| 6,812,399 B2 | 11/2004 | Shaheen et al. | |
| 6,933,436 B2 | 8/2005 | Shaheen et al. | |
| 7,105,237 B2 | 9/2006 | Sotzing et al. | |
| 2003/0013050 A1* | 1/2003 | Schwark et al. | 430/527 |
| 2004/0242792 A1* | 12/2004 | Sotzing | 525/326.1 |
| 2006/0043887 A1* | 3/2006 | Patwardhan et al. | 313/506 |
| 2006/0076050 A1 | 4/2006 | Williams et al. | |
| 2006/0078761 A1 | 4/2006 | Williams et al. | |
| 2006/0175582 A1 | 8/2006 | Hammond et al. | |
| 2006/0237695 A1 | 10/2006 | Williams et al. | |

FOREIGN PATENT DOCUMENTS

| | | |
|---|---|---|
| EP | 0 834 885 A2 | 4/1998 |
| EP | 0834885 B1 | 4/1998 |
| EP | 1 634 922 A1 | 3/2006 |
| WO | WO 01/78464 A1 | 10/2001 |
| WO | WO 2004/072205 | 8/2004 |
| WO | WO 2005/091309 A1 | 9/2005 |
| WO | WO2009/135752 A1 | 11/2009 |

OTHER PUBLICATIONS

Hür, E., et al., "Corrosion performance of self-doped sulfonated polypyrrole coatings on stainless steel," Materials Chemistry and Physics, vol. 100, pp. 19-25 (2006).

International Search Report and Written Opinion for International Appl. No. PCT/US2007/015927, mailed Sep. 18, 2008 (20 pages).

Argun, et al., Adv. Mater. vol. 15, pp. 1338-1341 (2003).

Conjugated Polymers, Klumer Academic Press, Dorderecht, Breadas, J. L., Silbey, R., eds., (1991).

Francois, et al., Synth. Met., vol. 69, pp. 463-466 (1995).

Friend, R. H., et al., "Electroluminescence in Conjugated Polymers", Handbook of Conducting Polymers, 2nd Ed., Chptr. 29, pp. 823-846 (1998).

Hebner, et al., Appl. Phys. Letts., vol. 72, No. 5, pp. 519-521 (1998).

Hempenius, et al., J. Am. Chem. Soc., vol. 120, pp. 2798-2804 (1998).

Jenekhe, et al., Science, vol. 279, pp. 1903-1907 (1998).

Katz, et al., Accounts of Chmeical Research, vol. 34, No. 5, pp. 359-367 (2001).

Kraft, et al., "Electroluminescent Conjugated Polymers—Seeing Polymers in a New Light," Angew. Chem. In. Ed., vol. 37, pp. 402-428 (1998).

U.S. Appl. No. 60/612,640, filed Sep. 24, 2004, Williams et al.

U.S. Appl. No. 60/612,641, filed Sep. 24, 2004, Williams et al.

U.S. Appl. No. 60/760,386, filed Jan. 20, 2006, Greco et al.

Lee, B., et al., "Ring-Sulfonated Poly(thienothiophene)", Adv. Mater. vol. 17, pp. 1792-1795 (2005).

Lee, et al., Synth. Met. vol. 139, pp. 457-461 (2003).

Li, et al., Macromolecules, vol. 32, pp. 3034-3044 (1999).

McCullough, R. D., et al., "Regioregular, Head-to-Tail Coupled Poly(3-alkylthiophene) and it Derivatives," Handbook of Conducting Polymers, 2nd Ed., Chptr. 9, pp. 225-258 (1998).

McCullough, R. D., et al., "The Chemistry of Conducting Polythiophenes," Adv. Mater. vol. 10, No. 2, pp. 93-116 (1998).

Noshay, et al., Block Copolymers, Overview and Critical Survey, Academic Press, Chptrs. 5 & 7 (1977).

International Search Report, PCT/US2007/001245, mailed Oct. 2, 2007 (1 page).

Roncali, J., Chem. Rev., vol. 92, pp. 711 (1992).

Schopf, et al., Polythiophenes: Electrically Conductive Polymers, Springer: Berlin (1997).

Sotzing et al., Adv. Mater., vol. 9, pp. 795 (1997).

The Encyclopedia of Polymer Science and Engineering, Wiley, pp. 298-300 (1990).

Udman, Y .A., et al., "Electropolymerization of self-doped polythiophene", Synth. Met. vol. 142, pp. 7-12 (2004).

Udman, Y. A., et al., "Electrochemical synthesis of soluble sulfonated poly(3-methyl thiophene)", Eur. Poly. J., vol. 40, pp. 1057-1062 (2004).

Wang, et al., J. Am. Chem. Soc., vol. 122, pp. 6855-6861 (2000).

Widawski, et al., Nature (London), vol. 369, pp. 387-389 (1994).

Yang, et al., Macromolecules, vol. 26, pp. 1188-1190 (1993).

Zhang, et al., Adv. Mater. vol. 14, pp. 662-665 (2002).

Pilston, R. L., et al, "Toward highly fluorescent polythiophenes: head-to-tail coupled copolymers of 3-(methoxyethoxyethoxymethyl)thiophene and 3-(perfluoroalkyl) thiophene",Synthetic Metals, vol. 111/112, pp. 433-436 (2000).

Sheina, E. E., et al., "Highly Conductive, Regioregular Alkoxy-Functionalized Polythiophenes: A New Class of Stable, Low Band Gap Materials", Chem. Mat., vol. 17, No. 13, pp. 3317-3319 (Jun. 2005).

Udum, Y. A., et al., Electrochemical synthesis of soluble sulfonated poly(3-methyl thiophene), European Polymer Journal, vol. 40, pp. 1057-1062 (2004).

PCT/US2007/015927 (filed Jul. 13, 2007), Partial International Search Report, mailed Jul. 15, 2008 (4 pages).

* cited by examiner

SULFONATION OF CONDUCTING POLYMERS AND OLED, PHOTOVOLTAIC, AND ESD DEVICES

RELATED APPLICATIONS

This application claims priority to U.S. provisional application Ser. No. 60/832,095 filed on Jul. 21, 2006, which is incorporated by reference in its entirety, as well as to U.S. provisional application Ser. No. 60/845,172 filed on Sep. 18, 2006, which is incorporated by reference in its entirety.

STATEMENT OF FEDERAL FUNDING SUPPORT

These inventions were made with Government support under Agreement No. DAAD19-02-3-001 awarded by Army Research Laboratory. The government has certain rights in the inventions.

BACKGROUND

Although useful advances are being made in energy saving devices such as organic-based organic light emitting diodes (OLEDs), polymer light emitting diodes (PLEDs), and organic photovoltaic devices (OPVs), further improvements are still needed in providing better processing and performance. For example, one promising type of material is conducting polymers including for example polythiophenes and regioregular polythiophenes, the latter first invented by Richard McCullough. However, problems can arise with doping, purity, and solubility and processing. In particular, it is important to have very good control over the solubility of alternating layers of polymer (e.g., orthogonal or alternating solubility properties among adjacent layers). In particular, hole injection layers and hole transport layers can present difficult problems in view of competing demands and the need for very thin, but high quality, films.

A need exists for a good platform system to control properties of hole injection and transport layers such as solubility and electronic energy levels like HOMO and LUMO, so that the materials can be adapted for different applications and to function with different materials such as light emitting layers, photoactive layers, and electrodes. In particular, good solubility properties are important, as well as the control of energy levels like HOMO and LUMO and the ability to formulate the system for a particular application and provide the required balance of properties.

Polythiophenes and regioregular polythiophenes are particularly important. Background references regarding polythiophenes include (1) Sotzing, G. A. Substituted thieno[3,4-b]thiophene polymers, method of making and use thereof, US2005/0124784 A1, (2) Lee, B.; Seshadri, V.; Sotzing, G. A. Ring Sulfonated poly(thieno[3,4-b]thiophene), *Adv. Mater.* 2005, 17, 1792. (3) Udman, Y. A.; Pekmez, K.; Yildiz, A. *Synth. Met.* 2004, 142, 7. (4). Udman, Y. A.; Pekmez, K.; Yildiz, A. *Eur. Poly. J* 2004, 40, 1057. (5) "*Method for producing soluble conductive polymers having acidic groups*" EP0834885B1.

Prior art often provides however important limits such as, for example, unstable doping, lack of solubility in starting polymers, lack of versatility in formulation, lack of solvent control, limited fused systems, random sulfonation, lack of copolymerization, lack of control of molecular weight, lack of structural control and regioregularity, lack of interaction between side group and conjugated chain, and also lack of device data.

SUMMARY

Sulfonation and sulfonated polymers can be used to improve performance and processes, particularly with polythiophenes and regioregular polythiophenes. The various embodiments include compositions, methods of making compositions, methods of using compositions, and devices. For example, one embodiment provides a composition comprising: a water soluble or water dispersible regioregular polythiophene comprising (i) at least one organic substituent, and (ii) at least one sulfonate substituent comprising sulfonate sulfur bonding directly to the polythiophene backbone.

Another embodiment is a composition comprising: a water soluble, water dispersible, or water swellable regioregular polythiophene comprising (i) at least one organic substituent, and (ii) at least one sulfonate substituent comprising sulfonate sulfur bonding directly to the polythiophene backbone. More generally, another embodiment provides a composition comprising: a water soluble or water dispersible regioregular heterocyclic polymer comprising (i) at least one organic substituent, and (ii) at least one sulfonate substituent comprising sulfonate sulfur bonding directly to the polymer backbone. The heterocyclic polymer can be for example a nitrogen-containing or a sulfur-containing heterocyclic polymer.

Another embodiment comprises a method for making a composition comprising: reacting a soluble regioregular polythiophene comprising (i) at least one organic substituent with a sulfonation reagent so that the polythiophene comprises at least one sulfonate substituent comprising sulfonate sulfur bonding directly to the polythiophene backbone.

Another embodiment provides a coating composition comprising: (A) water, (B) a water soluble or water dispersible regioregular polythiophene comprising (i) at least one organic substitutent, and (ii) at least one sulfonate substituent comprising sulfonate sulfur bonding directly to the polythiophene backbone, and (C) a synthetic polymer different from (B). The composition can further comprise a water-miscible solvent.

Still further, also provided is a method of making a coating composition comprising: (A) providing water, (B) providing a water soluble or water-dispersible regioregular polythiophene comprising (i) at least one organic substituent, and (ii) at least one sulfonate substituent comprising sulfonate sulfur bonding directly to the polythiophene backbone, (C) providing a synthetic polymer different from (B), (D) combining in any order (A), (B), and (C) to form a coating composition. The coating composition can also comprise a water-miscible solvent. In further steps, water can be removed to provide a coated surface or substrate.

Another embodiment is a coated substrate comprising: a solid surface, a coating disposed on the surface, wherein the coating comprises a composition comprising: a water soluble, water dispersible, or water swellable regioregular polythiophene comprising (i) at least one organic substituent, and (ii) at least one sulfonate substituent comprising sulfonate sulfur bonding directly to the polythiophene backbone.

Still further, another embodiment is a coated substrate comprising: (B) a water soluble, water-dispersible, or water swellable regioregular polythiophene comprising (i) at least one organic substituent, and (ii) at least one sulfonate substituent comprising sulfonate sulfur bonding directly to the polythiophene backbone, (C) a synthetic polymer different from (B).

The films can show excellent stability including substantially no change in the UV-vis-NIR over seven days. The UV-vis-NIR spectra can also be sensitive to pH which provides for applications.

Also provided are devices. For example, herein is provided a device comprising a layer comprising the composition comprising: a water soluble or water dispersible regioregular polythiophene comprising (i) at least one organic substituent, and (ii) at least one sulfonate substituent comprising sulfonate sulfur bonding directly to the polythiophene backbone. In one embodiment, the layer is a hole injection layer or a hole transport layer. The device can be for example an OLED device, a PLED device, a SMOLED device, or a photovoltaic device. The device can comprise at least two electrodes and at least one light emitting or photoactive layer.

Another embodiment is a device comprising an electrostatic dissipation (ESD) material, said ESD material comprising at least one water soluble or water dispersible polymer comprising regioregular polythiophene comprising: (i) at least one organic substituent; and (ii) at least one sulfonate substituent comprising sulfonate sulfur bonding directly to the polythiophene backbone.

Another embodiment provides a method of reducing electrostatic charge on a device comprising coating said device with a coating comprising a polythiophene comprising: (i) at least one organic substituent; and (ii) at least one sulfonate substituent comprising sulfonate sulfur bonding directly to the polythiophene backbone.

Important aspects of one or more of these embodiments include that the dopant ion is present on the backbone of the polymer and hence migration into other components of the device is eliminated. The composition can be totally free or substantially free of separately added small molecule or polymeric dopants. In addition, the technology helps in altering the energy levels of the polymer by merely varying the sulfonation levels on the polymer backbone. Still further, donor and acceptor type polymer is provided which has both the donor and acceptor functionality on the same repeat unit. Another feature is that the polymer structure is well-defined with alternating donor acceptors. Also important is a method to convert an otherwise water insoluble polymer into water soluble or water dispersible polymer. A method is also provided to purify the substance of free sulfuric acid by passing through strong base type anion exchange resin (OH form). Another benefit comes from a method by which the resultant sulfonated polymer is highly water soluble making it easy to clean the reactor. Other advantages include processable polymer, easy to make, and excellent orthogonal compatibility with organic solvents.

Applications include for example hole injection layer for OLEDs, PLEDs, photovoltaic cells, electrostatic dissipation, supercapacitors, cation transducers, drug release, electrochromics, sensors, FETs, actuators, and membranes.

DETAILED DESCRIPTION

Introduction/Conducting Polymers and Polythiophenes

Figure 1:
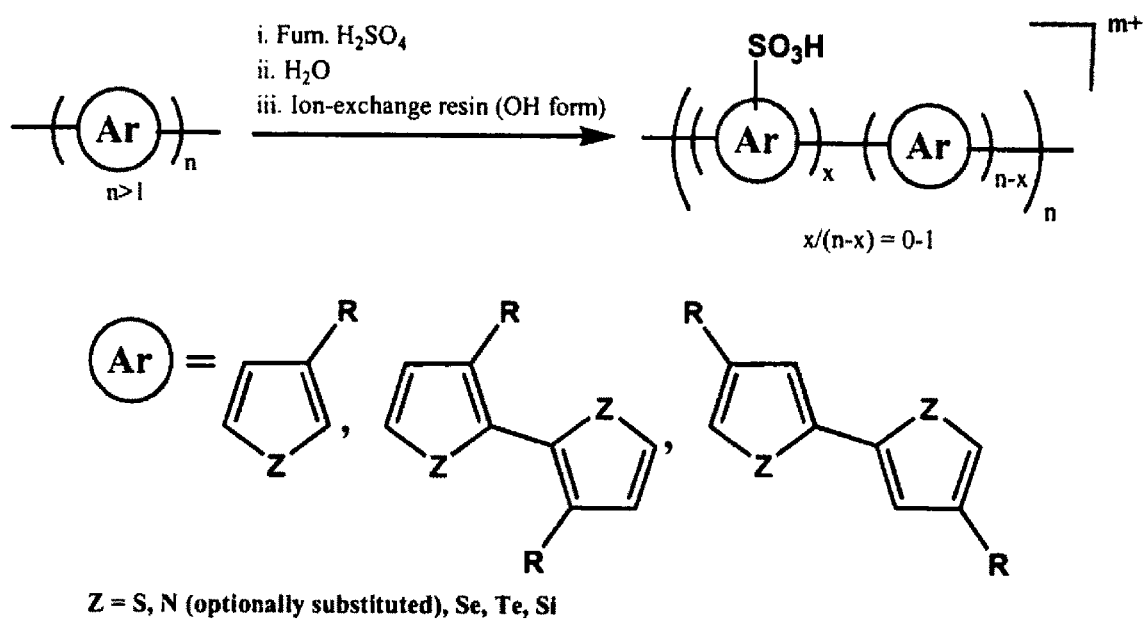
FIG. 1 illustrates representative synthesis of sulfonated conjugated polymers.

U.S. provisional patent application Ser. No. 60/832,095 "Sulfonation of Conducting Polymers and OLED and Photovoltaic Devices" filed Jul. 21, 2006 to Seshadri et al. is hereby incorporated by reference in its entirety including figures, working examples, and claims. In addition, U.S. provisional patent application Ser. No. 60/845,172 "Sulfonation of Conducting Polymers and OLED, Photovoltaic, and ESD Devices" filed Sep. 18, 2006 to Seshadri et al. is hereby incorporated by reference in its entirety including figures, working examples, and claims. These applications describe the following 97 embodiments:

Embodiment 1. A composition comprising: a water soluble or water dispersible regioregular polythiophene comprising (i) at least one organic substituent, and (ii) at least one sulfonated substituent comprising sulfur bonding directly to the polythiophene backbone.

Embodiment 2. The composition according to embodiment 1, wherein the sulfonated substituent is in acid form.

Embodiment 3. The composition according to embodiment 1, wherein the sulfonated substituent is in salt form comprising a counterion.

Embodiment 4. The composition according to embodiment 1, wherein the sulfonated substituent is in salt form comprising a counterion, wherein the counterion comprises organic groups.

Embodiment 5. The composition according to embodiment 1, wherein the sulfonated substituent is in salt form comprising a counterion, wherein the counterion comprises an organic cation and is free of metal.

Embodiment 6. The composition according to embodiment 1, wherein the sulfonated substituent is in salt form comprising a counterion, wherein the counterion comprises a metal cation.

Embodiment 7. The composition according to embodiment 1, wherein the polythiophene is a regio regular head-to-tail coupled poly(3-substituted thiophene) having a degree of regioregularity of at least about 90% apart from sulfonation.

Embodiment 8. The composition according to embodiment 1, wherein the polythiophene is a regio regular head to tail coupled poly(3-substituted thiophene) having a degree of regioregularity of at least about 98% apart from sulfonation.

Embodiment 9. The composition according to embodiment 1, wherein the polythiophene is water soluble.

Embodiment 10. The composition according to embodiment 1, wherein the polythiophene is doped.

Embodiment 11. The composition according to embodiment 1, wherein the organic substituent comprises at least one heteroatom.

Embodiment 12. The composition according to embodiment 1, wherein the organic substituent is an alkoxy or alkyl substituent.

Embodiment 13. The composition according to embodiment 1, wherein the polythiophene is an alternating copolymer.

Embodiment 14. The composition according to embodiment 1, wherein the polythiophene is prepared from a bithiophene monomer.

Embodiment 15. The composition according to embodiment 1, wherein the polythiophene is a homopolymer of a thiophene, a copolymer comprising thiophene units, or a block copolymer comprising at least one block of polythiophene.

Embodiment 16. The composition according to embodiment 1, wherein the water soluble or water dispersible regioregular polythiophene is in a crosslinked form.

Embodiment 17. The composition according to embodiment 1, wherein the polythiophene is characterized by a degree of sulfonation of about 50% to about 90%.

Embodiment 18. The composition according to embodiment 1, wherein polythiophene is water soluble, the polythiophene is a homopolymer, and wherein the organic substitutent is an alkoxy or alkyl substituent.

Embodiment 19. The composition according to embodiment 1, wherein the polythiophene is water soluble, and wherein the polythiophene is in salt form comprising a counterion, wherein the counterion comprises organic groups.

Embodiment 20. The composition according to embodiment 1, wherein the polythiophene is water soluble and is doped, wherein the polythiophene is a regio regular polythiophene having a degree of regioregularity of at least about 90%, and wherein the polythiophene is in acid form.

Embodiment 21. A method for making a composition according to embodiment 1 comprising: reacting a soluble regioregular polythiophene comprising (i) at least one organic substituent with a sulfonation reagent so that the polythiophene comprises at least one sulfonated substituent comprising sulfur bonding directly to the polythiophene backbone.

Embodiment 22. The method according to embodiment 21, wherein the sulfonation reagent is sulfuric acid.

Embodiment 23. The method according to embodiment 21, wherein the sulfonation reagent is a sulfate compound.

Embodiment 24. The method according to embodiment 21, wherein the reacted polythiophene is doped.

Embodiment 25. The method according to embodiment 21, wherein the reacting results in a degree of sulfonation of at least 10%.

Embodiment 26. The method according to embodiment 21, wherein the reacting results in a degree of sulfonation of at least 50%.

Embodiment 27. The method according to embodiment 21, wherein the reacting results in a degree of sulfonation of at least 75%.

Embodiment 28. The method according to embodiment 21, wherein the sulfonation reagent is sulfuric acid, and the reacting results in a degree of sulfonation of at least 75%.

Embodiment 29. The method according to embodiment 21, wherein the sulfonation reagent is sulfuric acid, and the reacting results in a degree of sulfonation of at least 75%, and wherein the polythiophene is a regio regular polythiophene having a degree of regioregularity of at least about 90%.

Embodiment 30. The method according to embodiment 21, wherein the reacting results in a degree of sulfonation of at least 50%, and wherein the polythiophene is a regio regular polythiophene having a degree of regioregularity of at least about 98%.

Embodiment 31. A coating composition comprising: (A) water, (B) a water soluble or water-dispersible regioregular polythiophene comprising (i) at least one organic substituent, and (ii) at least one sulfonated substituent comprising sulfur bonding directly to the polythiophene backbone, (C) a synthetic polymer different from (B).

Embodiment 32. The coating composition according to embodiment 31, further comprising an organic co-solvent.

Embodiment 33. The coating composition according to embodiment 31, further comprising an organic co-solvent, wherein the weight amount of water is greater than the weight amount of the organic co-solvent.

Embodiment 34. The coating composition according to embodiment 31, further comprising a second synthetic polymer different from (B) and (C).

Embodiment 35. The coating composition according to embodiment 31, wherein the synthetic polymer is a water-soluble polymer.

Embodiment 36. The coating composition according to embodiment 31, wherein the synthetic polymer has a carbon backbone with a polar functional group in the side group.

Embodiment 37. The coating composition according to embodiment 31, wherein the amount of the synthetic polymer (C) is at least three times the amount of the regioregular polythiophene (B).

Embodiment 38. The coating composition according to embodiment 31, wherein the amount of the synthetic polymer (C) is at least five times the amount of the regioregular polythiophene (B).

Embodiment 39. The coating composition according to embodiment 31, wherein the amount of the regioregular polythiophene polymer (B) is about 5 wt. % to about 25 wt. % with respect to the total amount of (B) and (C).

Embodiment 40. The coating composition according to embodiment 31, further comprising an organic co-solvent, wherein the weight amount of water is greater than the weight amount of the organic co-solvent, wherein the amount of the synthetic polymer (C) is at least three times the amount of the regioregular polythiophene (B), and wherein the amount of the regioregular polythiophene polymer (B) is about 5 wt. % to about 25 wt. % with respect to the total amount of (B) and (C).

Embodiment 41. A method of making a coating composition comprising: (A) providing water, (B) providing a water soluble or water-dispersible regioregular polythiophene comprising (i) at least one organic substituent, and (ii) at least one sulfonated substituent comprising sulfur bonding directly to the polythiophene backbone, (C) providing a synthetic polymer different from (B), (D) combining in any order (A), (B), and (C) to form a coating composition.

Embodiment 42. A coated substrate comprising: a solid surface, a coating disposed on the surface, wherein the coating comprises a composition comprising: a water soluble, water dispersible, or water swellable regioregular polythiophene comprising (i) at least one organic substituent, and (ii) at least one sulfonated substituent comprising sulfur bonding directly to the polythiophene backbone.

Embodiment 43. A coated substrate comprising: (B) a water soluble, water-dispersible, or water swellable regioregular polythiophene comprising (i) at least one organic substituent, and (ii) at least one sulfonated substituent comprising sulfur bonding directly to the polythiophene backbone, (C) a synthetic polymer different from (B).

Embodiment 44. A device comprising a layer comprising the composition according to embodiment 1.

Embodiment 45. The device according to embodiment 44, wherein the layer is a hole injection layer or a hole transport layer.

Embodiment 46. The device according to embodiment 44, wherein the device is an OLED device.

Embodiment 47. The device according to embodiment 44, wherein the device is a PLED device.

Embodiment 48. The device according to embodiment 44, wherein the device is a SMOLED device.

Embodiment 49. The device according to embodiment 44, wherein the device is a photovoltaic device.

Embodiment 50. The device according to embodiment 44, wherein the device comprises at least two electrodes and at least one light emitting or photoactive layer.

Embodiment 51. A device comprising the composition according to claim 1, wherein the device is a sensor, a supercapacitor, a cation transducer, a drug release device, an electrochromic device, a transistor, a field effect transistor, an actuator, or a transparent electrode.

Embodiment 52. A device comprising a hole injection layer or a hole transport layer, the layer comprising a sulfonated conducting polymer.

Embodiment 53. The device according to embodiment 52, wherein the conducting polymer is a heterocyclic conducting polymer.

Embodiment 54. The device according to embodiment 52, wherein the conducting polymer is a polythiophene.

Embodiment 55. The device according to embodiment 52, wherein the conducting polymer is a regioregular polythiophene.

Embodiment 56. A composition comprising: a water soluble or water dispersible regioregular heterocyclic polymer comprising (i) at least one organic substituent, and (ii) at least one sulfonated substituent comprising sulfur bonding directly to the polymer backbone.

Embodiment 57. A composition comprising: a water soluble, water dispersible, or water swellable regioregular polythiophene comprising (i) at least one organic substituent, and (ii) at least one sulfonated substituent comprising sulfur bonding directly to the polythiophene backbone.

Embodiment 58. A composition comprising: a water soluble, water dispersible, or water swellable polythiophene comprising (i) at least one organic substituent, and (ii) at least one sulfonated substituent comprising sulfur bonding directly to the polythiophene backbone, wherein the polythiophene backbone comprises an alternating structure.

Embodiment 59. A composition comprising: a water soluble or water dispersible regioregular polythiophene comprising (i) at least one organic substituent, and (ii) at least one sulfonated substituent comprising sulfur bonding directly to the polythiophene backbone, wherein the organic substituent (i) provides the regioregularity apart from the sulfonated substituent (ii).

Embodiment 60. A composition comprising: a water soluble or water dispersible regioregular polythiophene comprising (i) at least one organic substituent, and (ii) at least one sulfonated substituent comprising sulfur bonding directly to the polythiophene backbone, wherein the regioregular polythiophene comprises regioregular HH-TT or TT-HH poly(3-substituted thiophene) apart from sulfonation.

Embodiment 61. A device comprising an electrostatic dissipation (ESD) material, said ESD material comprising at least one water soluble or water dispersible polymer comprising regioregular polythiophene comprising: (i) at least one organic substituent; and (ii) at least one sulfonated substituent comprising sulfur bonding directly to the polythiophene backbone.

Embodiment 62. The device of embodiment 61 wherein the ESD material further comprises at least one polymer without regioregular polythiophene.

Embodiment 63. The device of embodiment 62 wherein the number average molecular weight of the polymer comprising regioregular polythiophene is about 5,000 to about 50,000.

Embodiment 64. The device of embodiment 62, wherein at least one polymer is cross-linked.

Embodiment 65. The device of embodiment 62 wherein the polymer comprising regioregular polythiophene, and the polymer without regioregular polythiophene form a compatible blend.

Embodiment 66. The device of embodiment 61 wherein the polymer comprising the regioregular polythiophene is a homopolymer.

Embodiment 67. The device of embodiment 61 wherein the polymer comprising the regioregular polythiophene is a copolymer.

Embodiment 68. The device of embodiment 61 wherein the polymer comprising regioregular polythiophene is a block copolymer, and one segment of the block copolymer comprises regioregular polythiophene.

Embodiment 69. The device of embodiment 61 wherein the regioregular polythiophene has a degree of regioregularity of at least 85%.

Embodiment 70. The device of embodiment 61 wherein the regioregular polythiophene has a degree of regioregularity of at least 95%.

Embodiment 71. The device of embodiment 61 wherein the amount of the regioregular polythiophene in the coating is less than about 50 wt. %.

Embodiment 72. The device of embodiment 61 wherein the amount of the regioregular polythiophene in the coating is less than about 30 wt. %.

Embodiment 73. The device of to embodiment 61 wherein the polymer which does not comprise regioregular polythiophene is a synthetic polymer.

Embodiment 74. The device of embodiment 61 or 62 wherein the material is organic, inorganic or ambient doped.

Embodiment 75. The device of embodiment 61 or 62 wherein the regioregular polythiophene is oxidized.

Embodiment 76. The device of embodiment 61 or 62 wherein the material is doped with Br, I, Cl or any combination thereof.

Embodiment 77. The device of embodiment 61 or 62 wherein the material is doped with: iron trichloride, gold trichloride, arsenic pentafluoride, alkali metal salts of hypochlorite, protic acids, benzenesulfonic acid and derivatives thereof, propionic acid, organic carboxylic and sulfonic acids, nitrosonium salts, NOPF$_6$, NOBF$_4$, organic oxidants, tetracyanoquinone, dichlorodicyanoquinone, hypervalent iodine oxidants, iodosylbenzene, iodobenzene diacetate or a combination thereof.

Embodiment 78. The device of embodiment 61 or 62 wherein the material further comprises a polymer comprising an oxidative functionality, acidic functionality, poly(styrene sulfonic acid) or a combination thereof.

Embodiment 79. The device of embodiment 61 or 62 wherein the material further comprises a Lewis acid, iron trichloride, gold trichloride, arsenic pentafluoride or a combination thereof.

Embodiment 80. The device of embodiment 61 or 62 wherein the material further comprises protic organic acids, inorganic acids, benzenesulfonic acids and derivatives thereof, propionic acid, organic carboxylic acids, sulfonic acids, mineral acids, nitric acids, sulfuric acids and hydrochloric acids.

Embodiment 81. The device of embodiment 61 or 62 wherein the material further comprises tetracyanoquinone, dichlorodicyanoquinone, hypervalent iodine, iodosylbenzene, iodobenzene diacetate or a combination thereof.

Embodiment 82. The device of embodiment 61 or 62 wherein the material is doped with oxygen, carbon dioxide, moisture, or a combination thereof.

Embodiment 83. The device of embodiment 61 wherein the material is applied via spin coating, ink jetting, roll coating, gravure printing, dip coating, or zone casting.

Embodiment 84. The device of embodiment 61 wherein the material is in a form to have thickness greater than 10 nm.

Embodiment 85. The device of embodiment 61 wherein the polymer comprising regioregular polythiophene is doped sufficiently to provide the material with an electronic conductivity of at least about $10^{-10}$ siemens/cm.

Embodiment 86. The device of embodiment 61, wherein the electronic conductivity of the material is about $10^{-13}$ siemens/cm to about $10^{-3}$ siemens/cm.

Embodiment 87. The device of embodiment 86 wherein the material is able to retain electronic conductivity of at least $10^{-13}$ for at least 1000 hrs.

Embodiment 88. The device of embodiment 61, wherein the material is applied to an insulative surface of said device.

Embodiment 89. The device of embodiment 61, wherein the material is applied to a surface of said device, said surface comprising: glass, silica, polymer or a combination thereof.

Embodiment 90. The device of embodiment 61, wherein the polymer comprising regioregular polythiophene is doped with an organic dopant and is substituted with a heteroatom.

Embodiment 91. The device of embodiment 61, wherein the regioregular polythiophene is doped with a quinone compound and the coating has a thickness of about 10 nm to about 100 nm, and wherein the polymer which does not comprise regioregular polythiophene comprises a polystyrene, a polystyrene derivative, a polyurethane, a polyacrylate, a polypyridine, or a polyvinyl phenol.

Embodiment 92. The device of embodiment 61, wherein transparency of the material is at least 90% over the wavelength region of 300 nm to 800 nm.

Embodiment 93. The device of embodiment 61 or 62 wherein the material is doped with solids, liquids, gases, or a combination thereof.

Embodiment 94. The device of embodiment 61 wherein said device is a component of a semiconductor device, display screen, projector, aircraft wide screen, vehicular wide screen or CRT screens.

Embodiment 95. The device according to embodiment 61, wherein the material is a coating or packaging material.

Embodiment 96. A method of reducing electrostatic charge on a device comprising coating said device with a coating comprising a polythiophene comprising: (i) at least one organic substituent; and (ii) at least one sulfonated substituent comprising sulfur bonding directly to the polythiophene backbone.

Embodiment 97. The method of embodiment 96, wherein said coating further comprises at least one polymer which does not comprise polythiophene.

Various terms are further described hereinbelow:

"Alkyl" can be for example straight chain and branched monovalent alkyl groups having from 1 to 20 carbon atoms, or from 1 to 15 carbon atoms, or from 1 to 10, or from 1 to 5, or from 1 to 3 carbon atoms. This term is exemplified by groups such as for example methyl, ethyl, n-propyl, iso-propyl, n-butyl, t-butyl, n-pentyl, ethylhexyl, dodecyl, isopentyl, and the like.

"Optionally substituted" groups can be for example functional groups that may be substituted or unsubstituted by additional functional groups. For example, when a group is unsubstituted by an additional group it can be referred to as the group name, for example alkyl or aryl. When a group is substituted with additional functional groups it may more generically be referred to as substituted alkyl or substituted aryl.

"Substituted alkyl" can be for example an alkyl group having from 1 to 3, and preferably 1 to 2, substituents selected from the group consisting of alkyl, substituted alkyl, alkoxy, substituted alkoxy, aryl, substituted aryl, aryloxy, substituted aryloxy, hydroxyl.

"Aryl" can be for example a monovalent aromatic carbocyclic group of from 6 to 14 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include phenyl, naphthyl, and the like.

"Substituted aryl" can be for example to an aryl group with from 1 to 5 substituents, or optionally from 1 to 3 substituents, or optionally from 1 to 2 substituents, selected from the group consisting of hydroxy, alkyl, substituted alkyl, alkoxy, substituted alkoxy, alkenyl, substituted alkenyl, substituted aryl, aryloxy, substituted aryloxy, and sulfonate "Alkoxy" can be for example the group "alkyl-O—" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like.

"Substituted alkoxy" can be for example the group "substituted alkyl-O—."

"alkylene" can be for example straight chain and branched divalent alkyl groups having from 1 to 20 carbon atoms, or from 1 to 15 carbon atoms, or from 1 to 10, or from 1 to 5, or from 1 to 3 carbon atoms. This term is exemplified by groups such as methylene, ethylene, n-propylene, iso-propylene, n-butylene, t-butylene, n-pentylene, ethylhexylene, dodecylene, isopentylene, and the like.

"Alkenyl" can be for example an alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" can be for example alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" can be for example the group aryl-O— that includes, by way of example, phenoxy, naphthoxy, and the like.

"Substituted aryloxy" can be for example substituted aryl-O— groups.

"Alkylene oxide" can be for example the group —($R^a$—O)$_n$—$R^b$ where $R^a$ is alkylene and $R^b$ is alkyl or optionally substituted aryl and n is an integer from 1 to 6, or from 1 to 3. Alkylene oxide can be for example groups based on such as groups as ethylene oxides or propylene oxides.

"salt" can be for example derived from a variety of organic and inorganic counter ions well known in the art and include, by way of example only, sodium, potassium, calcium, magnesium, ammonium, tetraalkylammonium, and the like; and when the molecule contains a basic functionality, salts of organic or inorganic acids, such as hydrochloride, hydrobromide, tartrate, mesylate, acetate, maleate, oxalate and the like.

In substituted groups described above, polymers arrived at by describing substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above descriptions can be constrained by a limitation that, for example, substituted aryl groups are limited to—substituted aryl-(substituted aryl)-substituted aryl.

Similarly, the above descriptions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

All references described herein are hereby incorporated by reference in their entirety.

One skilled in the art can employ the following references in the practice of the various embodiments described herein. In particular, several references describe conducting polymers, polythiophenes, regioregular polythiophenes, substituted polythiophenes, and OLED, PLED, and PV devices prepared from them, and these can be used in the practice of one or more of the present embodiments. In reciting a conducting polymer name, the name can also include derivatives thereof. For example, polythiophene can include polythiophene derivatives.

Electrically conductive polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, which is hereby incorporated by reference in its entirety. This reference also describes blending and copolymerization of polymers, including block copolymer formation.

In addition, provisional patent application Ser. No. 60/612,640 filed Sep. 24, 2004 to Williams et al. ("HETEROATOMIC REGIOREGULAR POLY(3-SUBSTITUTEDTHIOPHENES) FOR ELECTROLUMINESCENT DEVICES") and U.S. regular application Ser. No. 11/234,374 filed Sep. 26, 2005 are hereby incorporated by reference in their entirety including the description of the polymers, the figures, and the claims.

Provisional patent application Ser. No. 60/612,641 filed Sep. 24, 2004 to Williams et al. ("HETEROATOMIC REGIOREGULAR POLY (3-SUBSTITUTEDTHIOPHENES) FOR PHOTOVOLTAIC CELLS") and U.S. regular application Ser. No. 11/234,373 filed Sep. 26, 2005 are hereby incorporated by reference in their entirety including the description of the polymers, the figures, and the claims.

The U.S. regular application Ser. No. 11/350,271, to Williams et al, can be also used to practice the various embodiments described herein for hole injection and transport layers ("HOLE INJECTION/TRANSPORT LAYER COMPOSITIONS AND DEVICES"). Another reference which can be used is Williams et al, Ser. No. 11/376,550, COPOLYMERS OF SOLUBLE POLYTHIOPHENE WITH IMPROVED ELECTRONIC PERFORMANCE, filed Mar. 16, 2006.

Polythiophenes can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, 2$^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$— multiblock copolymers (chapter 7), which can form the basis of block copolymer types in the present invention.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science,* 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804;

The following article describes several types of regioregular systems beginning at page 97 and references cited therein: "The Chemistry of Conducting Polythiophenes," by Richard D. McCullough, *Adv. Mater.* 1998, 10, No. 2, pages 93-116. In a regioregular polymer, including a polythiophene, the degree of regioregularity can be, for example, about 90% or more, or about 95% or more, or about 98% or more, or about 99% or more. Methods known in the art such as, for example, NMR can be used to measure the degree of regioregularity. Regioregularity can arise in multiple ways. For example, it can arise from polymerization of asymmetric monomers such as a 3-alkylthiophene to provide head-to-tail (HT) poly(3-substituted)thiophene. Alternatively, it can arise from polymerization of monomers which have a plane of symmetry between two portions of monomer such as for example a bi-thiophene, providing for example regioregular HH-TT and TT-HH poly(3-substituted thiophenes).

In particular, substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substitutents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Thiophene polymers can be star shaped polymers with the number of branches being for example more than three and comprising thiophene units. Thiophene polymers can be dendrimers. See for example Anthopoulos et al., Applied Physics Letters, 82, 26, Jun. 30, 2003, 4824-4826, and further description of dendrimers hereinafter.

Heterocyclic polymers are particularly preferred. A particularly preferred system is the polythiophene system and the regioregular polythiophene system. Polymers can be obtained from Plextronics, Inc., Pittsburgh, Pa. including for example polythiophene-based polymers such as for example Plexcore, Plexcoat, and similar materials.

Another embodiment includes heterocyclic conjugated polymers which are relatively regioirregular. For example, the degree of regioregularity can be about 90% or less, or about 80% or less, or about 70% or less, or about 60% or less, or about 50% or less.

Sulfonation and Sulfonated Polymers

The aforementioned polymers can be subjected to sulfonation. FIG. 1 illustrates a general sulfonation scheme for different conducting polymers and heterocyclic types of conducting polymers, including those which have a heterocyclic atom such as S, N, Se, Te, and Si. R is not particularly limited but can be for example a group which provides a solubilizing function such as alkyl or alkoxy.

Figure 2:
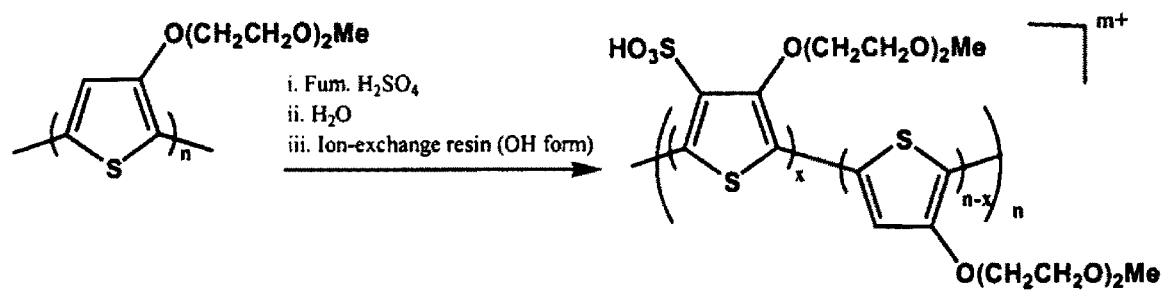
FIG. 2 illustrates sulfonation of poly(3-methoxyethoxyethoxythiophene) using fuming sulfuric acid.

FIG. 2 illustrates a polythiophene system. For example, some embodiments provide a composition comprising: a water soluble or water dispersible regioregular polythiophene comprising (i) at least one organic substituent, and (ii) at least one sulfonated substituent comprising sulfur bonding directly to the polythiophene backbone.

When a regioregular polymer is subjected to sulfonation, the polymer composition can be yet called regioregular for present purposes.

Sulfonation is generally known in the art, wherein there is an introduction into an organic molecule of the sulfonic acid group or its salts, —$SO_3H$, wherein the sulfur atom is bonded to carbon of the organic molecule. Examples in the patent literature include for example U.S. Pat. No. 5,548,060 to Allcock et al.; U.S. Pat. No. 6,365,294 to Pintauro et al.; U.S. Pat. No. 5,137,991 to Epstein et al.; and U.S. Pat. No. 5,993,694 to Ito et al. Additional sulfonation methods are described in for example (1) Sotzing, G. A. Substituted thieno[3,4-b]thiophene polymers, method of making and use thereof, US2005/0124784 A1; (2) Lee, B.; Seshadri, V.; Sotzing, G. A. Ring Sulfonated poly(thieno[3,4-b]thiophene), Adv. Mater. 2005, 17, 1792.

The sulfonated substituent can be in various forms. For example, the sulfonated substituent can be in acid form; or the sulfonated substituent can be in salt form comprising a counterion; or the sulfonated substituent can be in salt form comprising a counterion, wherein the counterion comprises organic groups; or the sulfonated substituent can be in salt form comprising a counterion, wherein the counterion comprises an organic cation including for example alkyl groups and is free of metal; or the sulfonated substituent is in salt form comprising a counterion, wherein the counterion comprises a metal cation.

Sulfonation of polymers can be carried out by methods known in the art using sulfonation reagents. In many cases, it is desirable to reduce the amounts of sulfonating agent needed and the amount of solvent needed. In many cases, it is desirable to reduce the amount of work-up needed including the amount of work-up solvent such as water to remove for example excess acid. Sulfonation is represented in FIGS. 1 and 2 for conducting polymers generally and for polythiophenes in particular. Solid polymer can be added to sulfonation reagent in film or powder form. Specialized processes can be used as needed such as micro-fluidizer or ultrafiltration including use of ultrafiltration membrane filters and use of continuous processes.

For example, polythiophene can be treated with fuming sulfuric acid at temperatures of for example about 0 to about 100 degrees celsius, or about 22 to about 100 degrees celsius, or about 50 to about 100 degrees celsius, or about 80-85 degrees celsius.

The degree of sulfonation can be controlled to for example about 5% to about 95%, or about 10% to about 90%, or to about 25% to about 75%. As sulfonation progresses, the sulfonated polythiophene is solublized and/or dispersed in the strong acid.

If desired, the polymers can be treated with ion exchange resins or treated by ultrafiltration.

Figure 3:
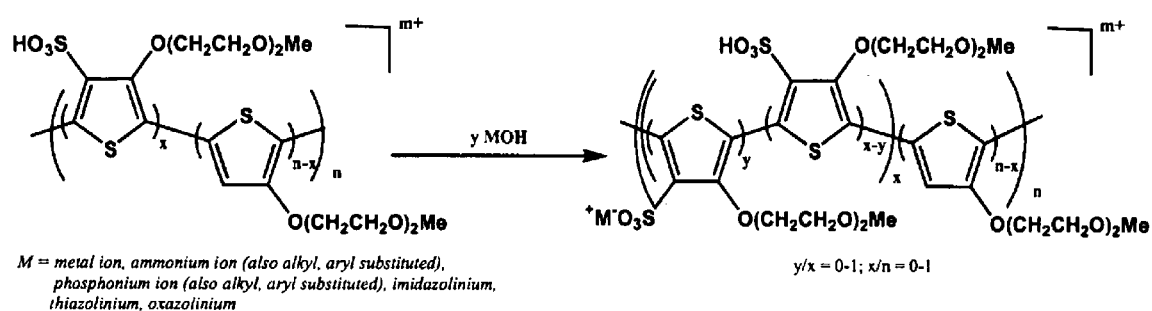
FIG. 3 illustrates conversion of sulfonic acid to sulfonate form.

After sulfonation, the sulfonated polymer can be modified as illustrated in for example FIG. 3. A variety of bases can be used; exchange of a variety of counterions can be used. This can result in for example (i) neutralizing acid, and/or (ii) tuning the energy levels and altering of hole injection ability. FIG. 3 illustrates for example metal ion, ammonium ion (including alkyl and aryl substituted), phosphonium ion (also alkyl or aryl substituted), imidazolinium, thiazolinium, and oxazolinium. Modification can also provide better solubility including for example better solubility in organic solvents such as for example aprotic solvents such as N,N-dimethylformamide (DMF), N,N-dimethyl acetamide (DMAc), N-methylpyrrolidinone (NMP), dimethylsulfoxide (DMSO), and the like. Another example of modification is conversion of sulfonic acid to an alkyl/aryl sulfonate ester which could be further substituted. Polymers can be dedoped by addition of a variety of forms of appropriate base in appropriate quantities. In some cases, this can be observed from blue shifting of the absorption of the conjugated polymer.

Figure 4:
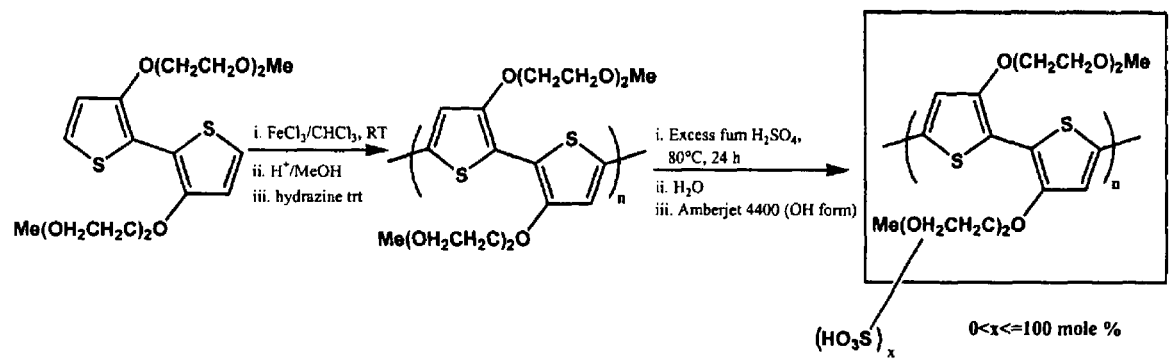
FIG. 4 illustrates another embodiment with a dimerized thiophene monomer.

The type of polymer to be sulfonated can be varied as illustrated in for example FIG. 4 for a bis-thiophene monomer. Dimers can be used in making polymers. Symmetrical dimers can be used. Examples include those which are HH or TT (head to head, tail to tail, respectively) coupled but have at least one position open for sulfonation.

In a preferred embodiment, the polymer provides one position for sulfonation.

The polymer microstructure and regioregularity can provide polymers wherein alternating donors and acceptors can be made.

Sulfonation can be performed on the neutral conjugated polymer.

Absorption spectra can be used to confirm that the polymer is self-doped. For example, absorption can extend into the near IR.

Figure 5:
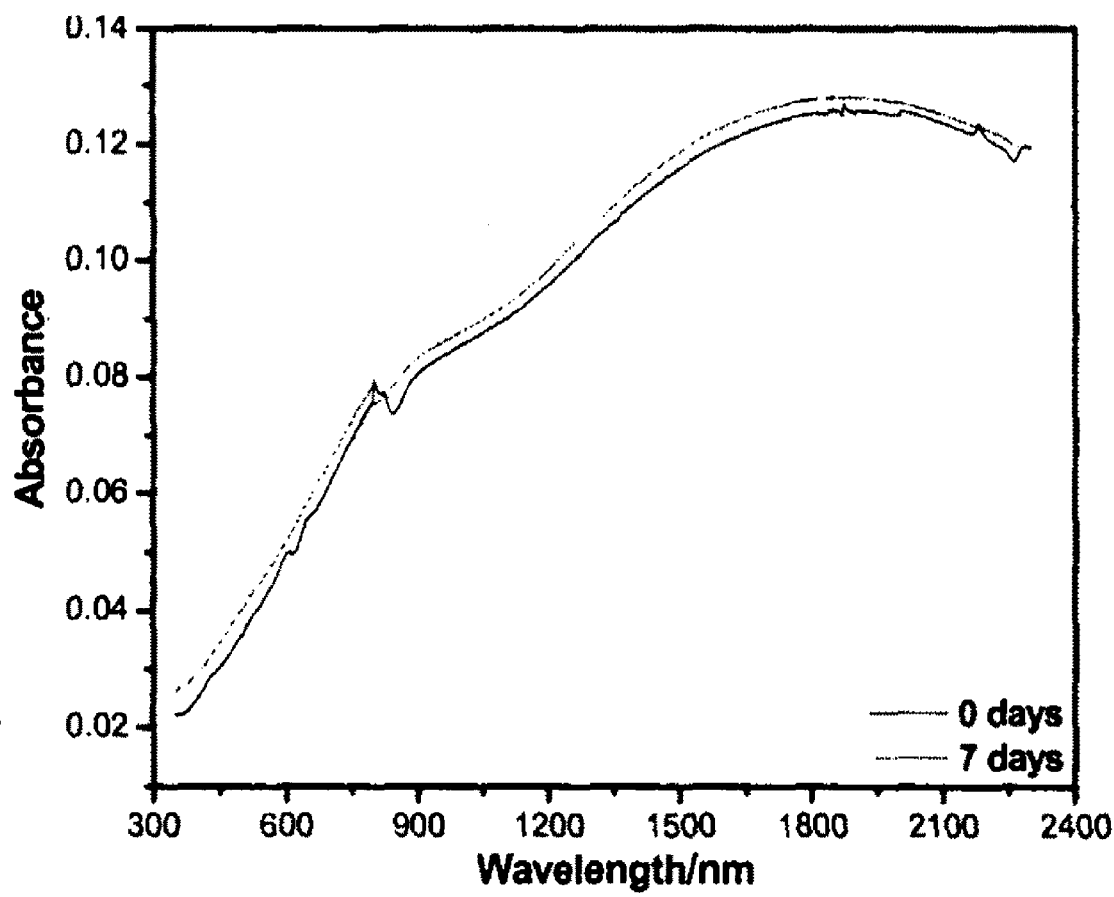
FIG. 5 illustrates seven day stability data based on UV-Vis-NIR data.
Figure 6:
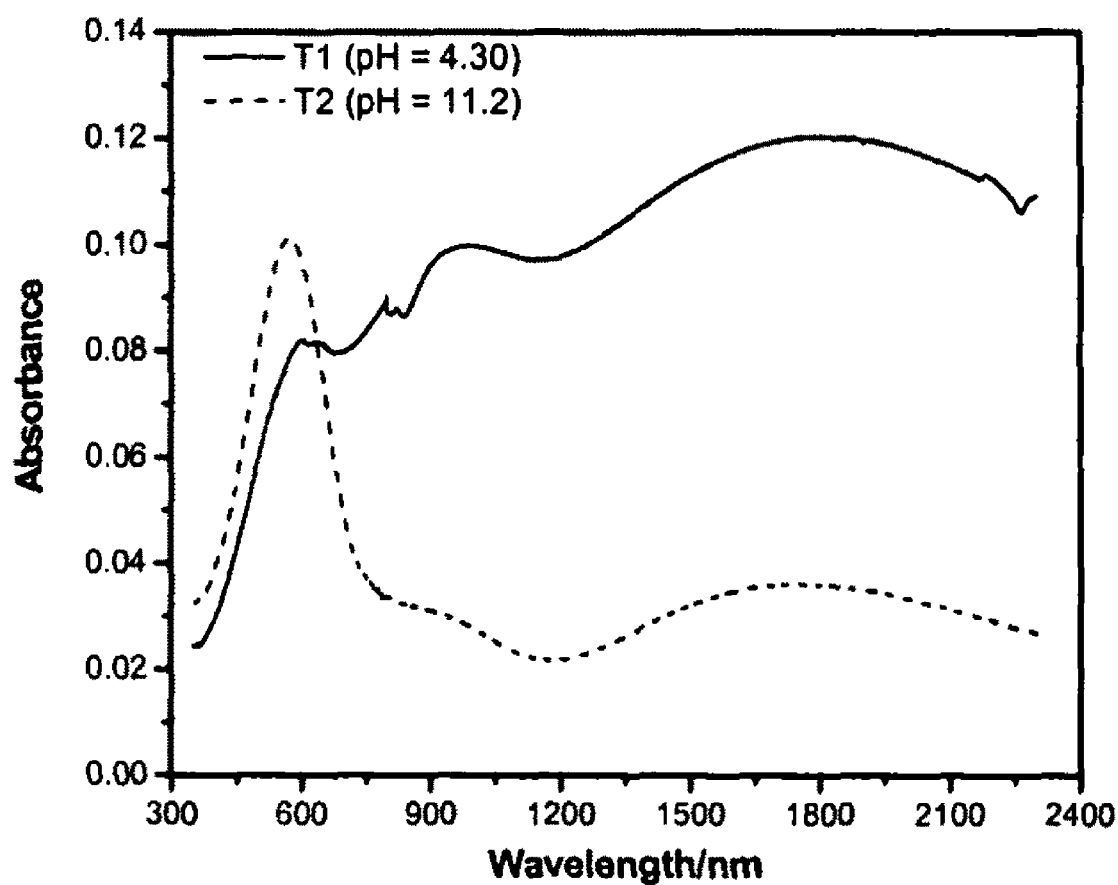
FIG. 6 illustrates absorption spectra at two different pHs.

The polymers can be very stable in the self-doped state as illustrated in FIG. 5. The properties of the polymer can be controlled by pH and acid content as illustrated in FIG. 6 for pH. Raising pH is a particularly important formulation strategy. Titration and neutralization can be carried out. Examples of acid content include at least 10 mg NaOH/g solids, or at least 50 mg NaOH/g solids, at least 100 mg NaOH/g solids, or at least 200 mg NaOH/g solids including for example 10 mg NaOH/g solids to about 250 mg NaOH/g solids. pH values can be for example 1.8 to 3.0, or 1.9 to 5, or 2.0 to 7.0. In many cases, it is desirable to be less acidic than the PEDOT/PSS material. pH can vary with the percentage of solids.

The direct bonding of the sulfonate sulfur atom to the polythiophene can provide tunability of band gap structure.

In many cases, good dispersibility is desired. Both water soluble and water dispersible polymers can be used and in many instances it may not be that important for performance whether the polymer forms a true solution.

Preferred embodiments include for example the polythiophene is a regio regular polythiophene having a degree of regioregularity of at least about 90%; the polythiophene is a regio regular polythiophene having a degree of regioregularity of at least about 98%; the polythiophene is water soluble; the polythiophene is doped; the organic substitutent comprises at least one heteroatom; the organic substituent is an alkoxy or alkyl substituent; the polythiophene is an alternating copolymer; the polythiophene is prepared from a bithiophene monomer; wherein the polythiophene is a homopolymer of a thiophene, a copolymer comprising thiophene units, or a block copolymer comprising at least one block of polythiophene; the polythiophene is characterized by a degree of sulfonation of about 10% to about 90%; the polythiophene is characterized by a degree of sulfonation of about 50% to about 90%; the polythiophene is water soluble, the polythiophene is a homopolymer, and wherein the organic substitutent is an alkoxy or alkyl substituent; the polythiophene is water soluble, and wherein the polythiophene is in salt form comprising a counterion, wherein the counterion comprises organic groups; and the polythiophene is water soluble and is doped, wherein the polythiophene is a regio regular polythiophene having a degree of regioregularity of at least about 90%, and wherein the polythiophene is in acid form. The water soluble or water dispersible polythiophene can be in crosslinked form so it is water swellable.

The polymer can be converted to film form by methods known in the art for characterization of for example UV-Vis-NIR properties and electrochemistry for the tuning of energy levels including HOMO and LUMO. Stability can be examined.

In some embodiments, sulfonation may also result in substitutent or side groups also comprising sulfonate groups. For example, an aromatic or phenyl group in the substituent could be sulfonated.

Additional Embodiments for Polymer

In addition, an embodiment for the polymer which can be subjected to sulfonation to produce sulfonated substituents on the polymer backbone can be represented by formula (I),

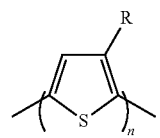

wherein R can be optionally substituted alkyl, optionally substituted alkoxy, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein R can be an optionally substituted alkylene oxide. Substituents can be for example hydroxyl, phenyl, or alkoxy groups; or wherein R can be optionally substituted ethylene oxide or optionally substituted propylene oxide or other lower alkyleneoxy units. Substituents can be for example hydroxyl, phenyl, or alkoxy groups; or R can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

Figure 15A:
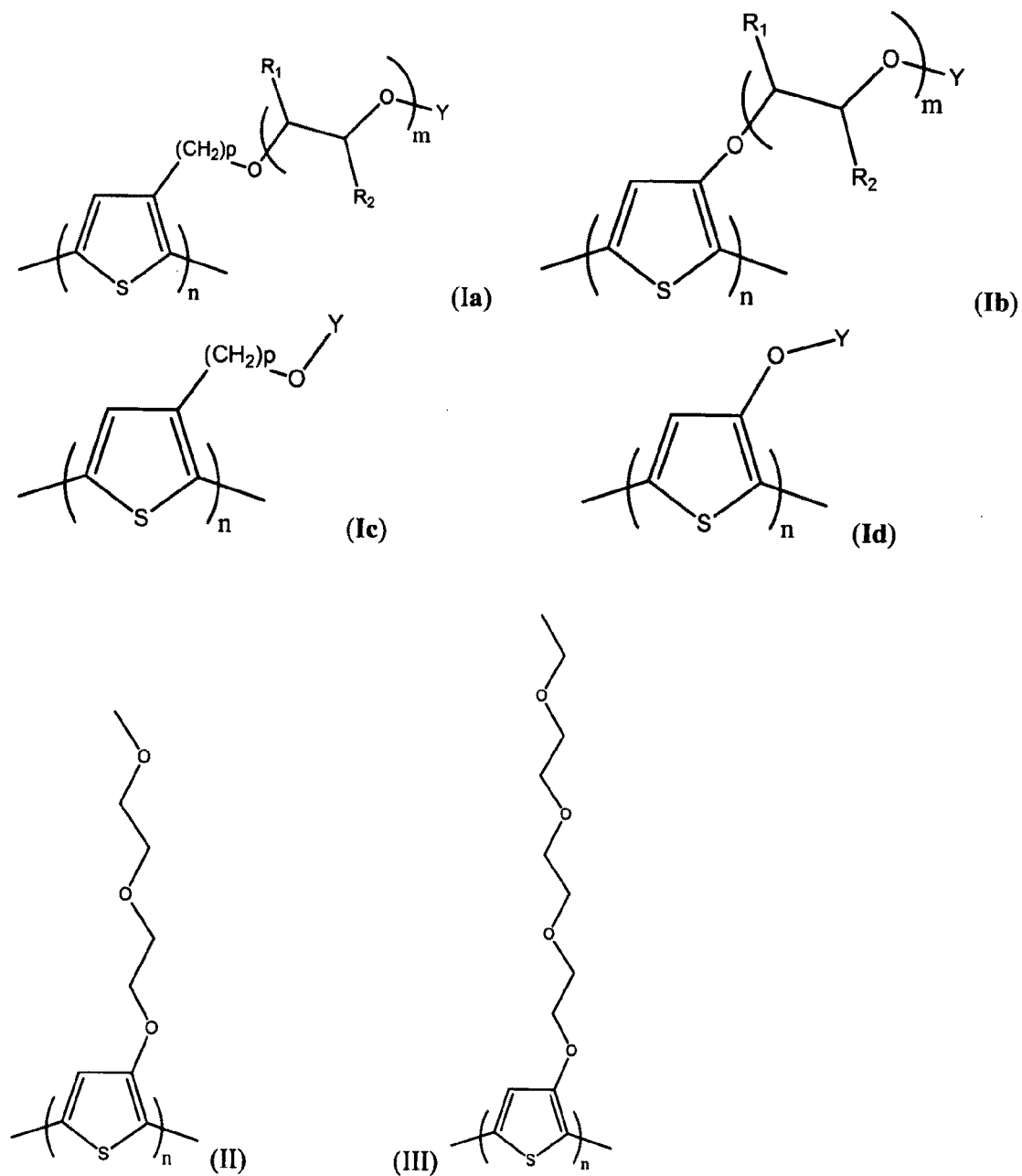
FIG. 15 illustrates additional embodiments for polymers.
Figure 15B:
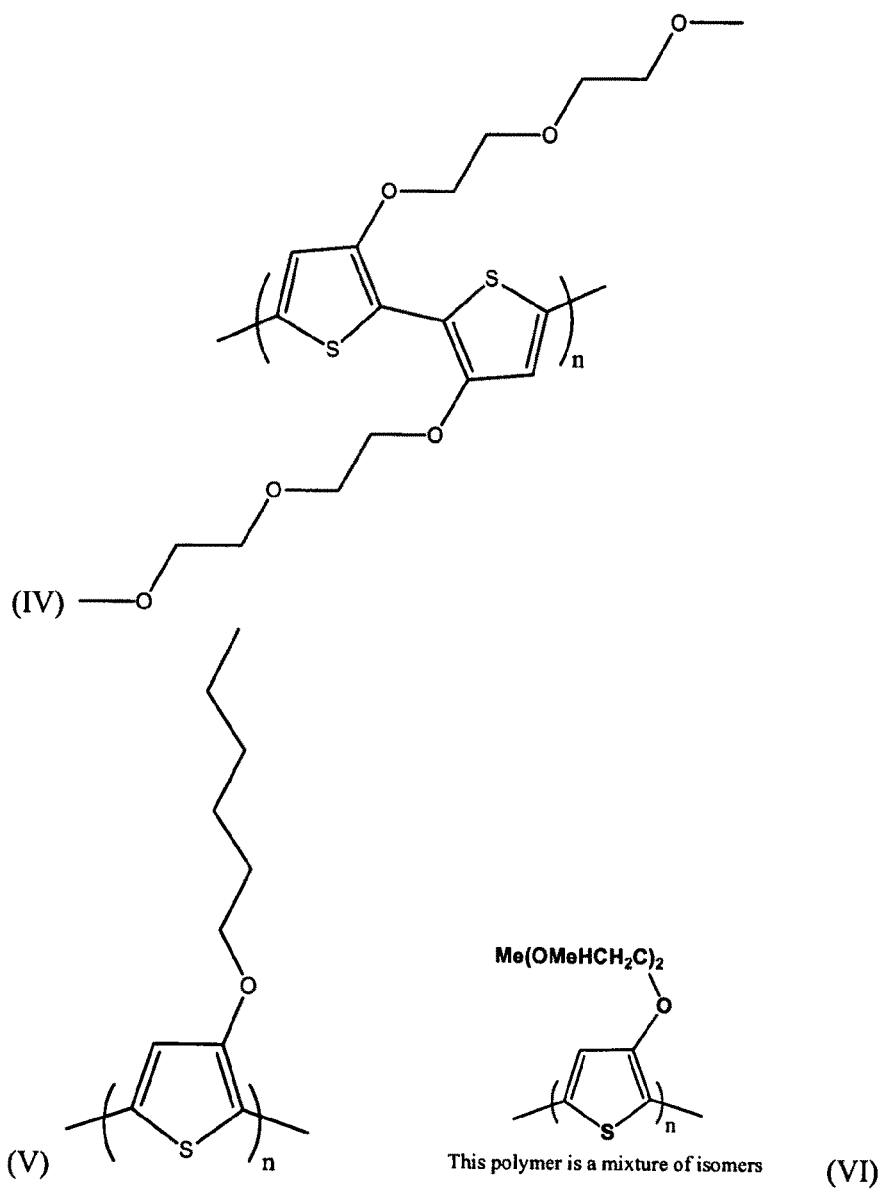

Examples of I are shown in FIG. 15.

In addition, the substitutent group R in (I) can be linked to the thiophene by an oxygen atom as alkoxy or phenoxy, wherein the substituent can be characterized by the corresponding alcohol or phenol, respectively. The alcohol, for example, can be linear or branched, and can have C2-C20, or C4-C18, or C6 to C14 carbon atoms. The alcohol can be for example an alkyl alcohol, or an ethylene glycol, or a propylene glycol, or a diethylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. Trade names are well known in this art. See for example DOW P-series and E-series glycol ethers.

The structure shown in (I) can stand alone as a polymer or it can be part of a block copolymer with another segment.

In FIG. 15, the n value for the polymers Ia, Ib, Ic, and Id can reflect molecular weights known in the art and in references cited herein such as for example, 25-5,000, or 50-1,000;

In FIG. 15, the p value for Ia-Id can be for example 0, 1, or 2.

In FIG. 15, for the polymers Ia, Ib, Ic, and Id, the m value can be for example 0, 1, 2, 3, or 4, or even higher such as for example 6, 11, or 16 (e.g., as found in Carbowax PEG 350, 550, 750).

In FIG. 15, for the polymers Ia, Ib, Ic, and Id, Y can be for example hydrogen, C1-C8 alkyl, optionally substituted C1-C6 alkenyl, and aryl. In addition, Y can be for example hydrogen, optionally substituted vinyl, optionally substituted allyl, methyl, ethyl, propyl, butyl, hexyl, octyl, or phenyl.

Alternatively, Y can be for example hydrogen, methyl, ethyl, prop-1-yl, hex-1-yl, hex-2-yl, hex-3-yl, oct-1-yl, oct-2-yl, oct-3-yl, oct-4-yl.

In FIG. 15, for the polymers Ia, Ib, Ic, and Id, R1 and R2 independently can be selected from hydrogen and methyl, provided that only one of R1 and R2 is methyl. R1 and R2 can be each hydrogen. R1 can be methyl and R2 can be hydrogen. R1 can be hydrogen and R2 can be methyl.

Methods of Making Sulfonated Polymers

Described herein also are methods of making compositions and methods of using compositions. For example, one embodiment provides a method for making a composition according to claim 1 comprising: reacting a soluble regioregular polythiophene comprising at least one organic substituent with a sulfonation reagent so that the polythiophene comprises at least one sulfonated substituent comprising sulfur bonding directly to the polythiophene backbone. In preferred embodiments, the sulfonation reagent is sulfuric acid; the sulfonation reagent is a sulfate compound; the reacted polythiophene is doped; the reacting results in a degree of sulfonation of at least 10%; the reacting results in a degree of sulfonation of at least 50%; the reacting results in a degree of sulfonation of at least 75%; the sulfonation reagent is sulfuric acid, and the reacting results in a degree of sulfonation of at least 75%; the sulfonation reagent is sulfuric acid, and the reacting results in a degree of sulfonation of at least 75%, and wherein the polythiophene is a regio regular polythiophene having a degree of regioregularity of at least about 90%; and the reacting results in a degree of sulfonation of at least 50%, and wherein the polythiophene is a regio regular polythiophene having a degree of regioregularity of at least about 98%.

The degree of sulfonation can be for example about 10% to about 100%, or about 30% to about 90%, or about 50% to 90%.

The acid value or acid number (mg KOH/g polymer) can be adapted for an application but can be for example about 250 mg KOH/g polymer, or about 50 to about 250 mg KOH/g polymer, or about 75 to about 200 mg KOH/g polymer, or about 100 to about 150 mg KOH/g polymer. This can be less than competitive polymers such as for example CH8000 which has 651 mg KOH/g solid. A solution formulated for, for example, an HIL application can have an acid value of for example about 0.1 to about 0.8 mg KOH/g HIL solution, or about 0.2 mg to about 0.6 mg KOH/g HIL solution.

The pH of the formulation can be for example greater than about 2, or about 2.0 to about 3.0, or about 2.3 to about 2.7. This can be less acidic than a variety of competitive materials such as for example Baytron A14083 which exhibits a pH of about 1.7 and CH8000 which exhibits a pH of about 1.3.

Formulation and Blending

The conducting polymer and polythiophene compositions, sulfonated as described above, can be formulated and blended by methods known in the art to formulators including, for example, varying the amounts of the components, varying combinations of different structural types, use of different mixing conditions, using different solvents, applying different film preparation conditions, using different purification methods, and the like. Formulations for specific applications in hole injection technology are particularly important.

The blend can be compatible when it is not characterized by excessive phase separation and forms functionally useful, mechanically stable films which can function as a hole injection layer. Compatible blends are known in the art. See, for example, U.S. Pat. Nos. 4,387,187; 4,415,706; 4,485,031; 4,898,912; 4,929,388; 4,935,164; and 4,990,557. Compatible blends do not have to be miscible blends, but are sufficiently mixed and stable to provide useful function, particularly in thin film form such as, for example, about 2 nm to about 100 nm. Blending methods may include solution blending of a predissolved conducting polymer either in neutral or oxidized form disintegrated into nanosized particles (typically from tens to hundreds of nanometers) with conventional polymers (e.g., polystyrene (PS), poly(methyl methacrylate) (PMMA), poly(vinyl acetate) (PVA)) by sonicating, agitation, or shear. Such blends provide fine dispersion of film-forming submicronic particles of stable polymer matrix solutions. Films can be prepared and analyzed for compatibility by spin coating.

In this invention, a matrix component can be used which helps provide the needed properties, such as planarization, for the hole injection or hole transport layers. The matrix component, including planarizing agents, when blended with the hole injection component, will facilitate the formation of the HIL or HTL layer in a device such as an OLED or PV device. It will also be soluble in the solvent that is used to apply the HIL system. The planarizing agent may be comprised of, for example, a polymer or oligomer such as an organic polymer such as poly(styrene) or poly(styrene) derivatives, poly(vinyl acetate) or its derivatives, poly(ethylene glycol) or its derivatives, poly(ethylene-co-vinyl acetate), poly(pyrrolidone) or its derivatives (e.g., poly(1-vinylpyrrolidone-co-vinyl acetate)), poly(vinyl pyridine) or its derivatives, poly(methyl methacrylate) or its derivatives, poly(butyl acrylate) or its derivatives. More generally, it can be comprised of polymers or oligomers built from monomers such as $CH_2CHAr$, where Ar=any aryl or functionalized aryl group, isocyanates, ethylene oxides, conjugated dienes, $CH_2CHR_1R$ (where R1=alkyl, aryl, or alkyl/aryl functionalities and R=H, alkyl, Cl, Br, F, OH, ester, acid, or ether), lactam, lactone, siloxanes, and ATRP macroinitiators.

More than one non-conductive polymer can be used in the formulation.

In this invention, the planarizing agent and the hole injection component could be represented by a copolymer that contains an ICP segment and a non-conjugated segment with a composition like similar to that described herein.

In this invention, the planarizing agent can also be a "non-fugitive", small molecule that is soluble in the application solvent, but does not evaporate upon removal of the solvent. It may possess alkyl, aryl, or functional alkyl or aryl character.

In addition to facilitating the providing of a smooth surface to the HIL layer, the matrix component or planarization agent can also provide other useful functions such as resistivity control and transparency control. Planarity can be determined by methods known in the art including AFM measurements.

The solvent system, or solvents for dispersing polymers, can be a mixture of water and organic solvent, including water miscible solvents, and solvents that comprise oxygen, carbon, and hydrogen, such as for example an alcohol or an etheric alcohol. Additional examples of water miscible solvents include alcohols such as isopropanol, ethanol, and methanol, and ethylene glycols and propylene glycols from Dow Chemical and Eastman Chemical. See for example Cellosolve, Carbitol, propane diol, methyl carbitol, butyl cellosolve, Dowanol PM, In some embodiments, the amount of water can be greater than the amount of organic solvent. A wide variety of combination of solvents can be used including non-aqueous including alcohols and other polar solvents. The composition can comprise a first solvent and a second solvent, different than the first solvent.

In particular, water soluble resins and aqueous dispersions can be used. Aqueous dispersions can be for example poly (styrene sulfonic acid) (i.e. PSS dispersion), Nafion dispersion (e.g., sulfonated fluorinated polymers), latex, and polyurethane dispersions. Examples of water soluble polymers include polyvinylpyrollidinone and polyvinylalcohol. Other examples of resins include cellulose acetate resins (CA, CAB, CAP—Eastman).

Formulation can be carried out to modify surface energy, conductivity, film formation, solubility, crosslinking, morphology, film quality, specific application (e.g, spin coat, ink jet printing, screen printing, and the like).

Surfactants can be used including for example ionic and non-ionic surfactants, as well as polymer surfactants, fluorinated surfactants, and ionomers.

Resins and HIL inks can be dispersed and/or dissolved by any method known in the art including for example sonication.

If desired, the formulation can be formulated to include crosslinking agents which provide crosslinked structures which may swell but not dissolve upon crosslinking.

Preferred embodiments include for example a coating composition comprising: (A) water, (B) a water soluble or water-dispersible regioregular polythiophene comprising (i) at least one organic substituent, and (ii) at least one sulfonated substituent comprising sulfur bonding directly to the polythiophene backbone, and (C) a synthetic polymer different from (B); optionally further comprising an organic co-solvent; or further comprising an organic co-solvent, wherein the weight amount of water is greater than the weight amount of the organic co-solvent; or further comprising a second synthetic polymer different from (B) and (C); wherein the synthetic polymer is a water-soluble polymer; or wherein the synthetic polymer has a carbon backbone with a polar functional group in the side group; or wherein the amount of the synthetic polymer (C) is at least three times the amount of the regioregular polythiophene (B); wherein the amount of the synthetic polymer (C) is at least five times the amount of the regioregular polythiophene (B); or wherein the amount of the regioregular polythiophene polymer (B) is about 5 wt. % to about 25 wt. % with respect to the total amount of (B) and (C); or, and further comprising an organic co-solvent, wherein the weight amount of water is greater than the weight amount of the organic co-solvent, wherein the amount of the synthetic polymer (C) is at least three times the amount of the regioregular polythiophene (B), and wherein the amount of the regioregular polythiophene polymer (B) is about 5 wt. % to about 25 wt. % with respect to the total amount of (B) and (C).

Additional embodiments for materials and polymers that can be added to the formulation include, for example, poly(vinyl alcohol), including poly(vinyl alcohol) which is 88% hydrolyzed, poly(2-acrylamido-2-methyl-1-propane sulfonic acid), poly(2-acrylamido-2-methyl-1-propane sulfonic acid-co-styrene), poly(1-vinyl pyrolidone-co-vinyl acetate), poly(acrylamide-co-acrylic acid), polyurethane dispersion, acrylic latex dispersion, poly(styrene-ran-ethylene)sulfonated solution, poly(4-vinyl phenol)-co-PMMA, poly(vinyl acetate-co-butyl maleate-co-isobornyl acrylate), poly-4-vinylpyridine, and combinations thereof. In some cases, the poly-4-vinylpyridine may not provide as good results as other materials.

In another embodiment, the sulfonated polymer is dissolved or dispersed in water, or a mixture of water and a water soluble organic solvent, or an organic solvent. Optionally, additional ingredients can be mixed in including for example a second type of polymer.

The compositions can comprise a first solvent and a second solvent. For example, the first solvent can be water and the second solvent can be an organic solvent miscible with water. These two solvents can be mixed in a wide variety of ratios adapted for a particular application. In some cases, one can eliminate or substantially eliminate the first solvent, or eliminate or substantially eliminate the second solvent. The relative amount (by weight or volume) of the first solvent to second solvent can range from for example 100 parts first solvent and 0 parts second solvent, to 0 parts first solvent and 100 parts second solvent, or 90 parts first solvent and 10 parts second solvent, to 10 parts first solvent and 90 parts second solvent, 80 parts first solvent and 20 parts second solvent, to 20 parts first solvent and 80 parts second solvent, 30 parts first solvent and 70 parts second solvent, to 70 parts first solvent and 30 parts second solvent, 60 parts first solvent and 40 parts second solvent, to 40 parts first solvent and 60 parts second solvent.

For many formulations, the amount of sulfonated polymer is at least about 4 wt. % with respect to the solid content For some embodiment, the sulfonated polymer can be present with respect to total solid content at about 1 wt. % to about 10 wt. %, or about 4 wt. % to about 8 wt. %.

Coated Substrates

Also provided is a coated substrate comprising: a solid surface, a coating disposed on the surface, wherein the coating comprises a composition comprising: a water soluble, water dispersible, or water swellable regioregular polythiophene comprising (i) at least one organic substituent, and (ii) at least one sulfonated substituent comprising sulfur bonding directly to the polythiophene backbone. Surfaces useful in OLED and OPV applications can be used. For example, the solid surface can be for example an electrode including a transparent electrode such as indium tin oxide. The surface can be a light emitting polymer layer or a hole transport layer. The thickness of the coating can be for example 5 nm to 5 microns, 10 nm to 1 micron, 25 nm to 500 nm, or 50 nm to 250 nm. Residual solvent may be present. The coating may be crosslinked or patterned.

Also provided is a coated substrate comprising: (A) a solid surface having a coating disposed thereon comprising (B) a water soluble or water-dispersible regioregular polythiophene comprising (i) at least one organic substituent, and (ii) at least one sulfonated substituent comprising sulfur bonding directly to the polythiophene backbone, and (C) a synthetic polymer different from (B). Surfaces useful in OLED and OPV applications can be used. For example, the solid surface can be for example an electrode including a transparent electrode such as indium tin oxide. The surface can be a light emitting polymer layer or a hole transport layer. The thickness of the coating can be for example 5 nm to 5 microns, 10 nm to 1 micron, 25 nm to 500 nm, or 50 nm to 250 nm. Residual solvent may be present. The coating may be crosslinked or patterned.

Any coating or patterning method known in the art can be used. Microscale or nanoscale patterning can be carried out to form nanostructure or microstructures on the surface.

Printing processes can include for example flexography, letter press, soft lithography, gravure, pad, offset lithography, screen, and inkjet printing.

The surface can be the surface of a homogeneous, heterogeneous, or multilayer substrate.

Substrates can be those used in printed electronics. Substrates can be for example plastic, glass, metals, including silver and gold.

Films and Coatings and Properties

In this invention, the HIL system is preferred and can be applied by spin casting, drop casting, dip-coating, spray-coating, or by printing methods such as ink jet printing, offset printing, or by a transfer process. For example, ink jet printing is described in U.S. Pat. No. 6,682,175 to Otsuka and in Hebner et al., Applied Physics Letters, 72, no. 5, Feb. 2, 1998, pages 519-521.

In this invention, an HIL as a film of an HIL system can be provided that is about 10 nm to about 50 μm in thickness with typical thickness ranging from about 50 nm to about 1 μm. In another embodiment, thickness can be about 10 nm to about 500 nm, and more particularly, about 10 nm to about 100 nm.

Good surface smoothness and interfacial properties are important.

Device Fabrication and Testing

Various devices can be fabricated in many cases using multilayered structures which can be prepared by for example solution or vacuum processing, as well as printing and patterning processes. In particular, use of the embodiments described herein for hole injection and hole transport can be carried out effectively (HILs and HTLs for Hole Injection Layers, and Hole Transport Layers, respectively). In particular, applications include hole injection layer for OLEDs, PLEDs, photovoltaic cells, supercapacitors, cation transducers, drug release, electrochromics, sensors, FETs, actuators, and membranes. Another application is as an electrode modifier including an electrode modifier for an organic field effect transistor (OFETS). Other applications include those in the field of printed electronics, printed electronics devices, and roll-to-roll production processes.

Figure 7:
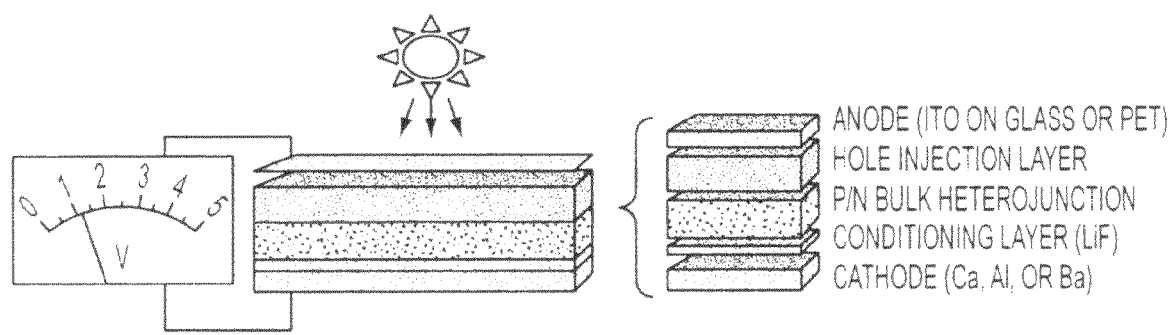
FIG. 7 illustrates a typical organic photovoltaic device.

For example, photovoltaic devices are known in the art as illustrated in for example FIG. 7. The devices can comprise, for example, multi-layer structures including for example an anode such as ITO on glass or PET; a hole injection layer; a P/N bulk heterojunction layer; a conditioning layer such as LiF; and a cathode such as for example Ca, Al, or Ba. Devices can be adapted to allow for current density versus voltage measurements.

Figure 9:
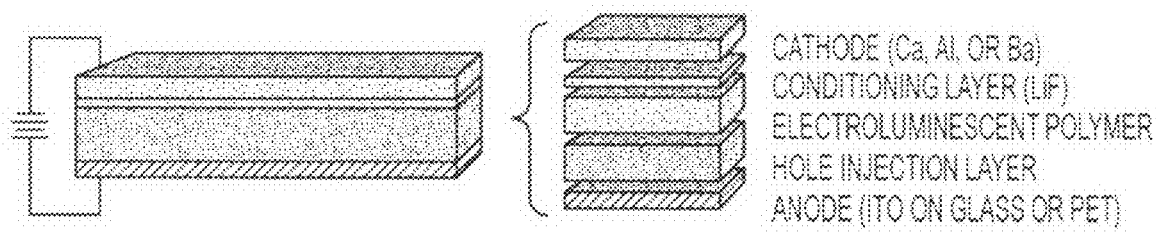
FIG. 9 illustrates a typical OLED device.
Figure 10A:
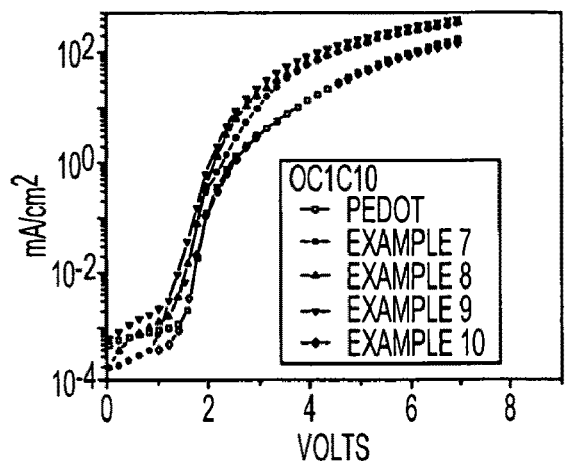
FIG. 10 illustrates device data indicative of HIL performance in $OC1C_{10}$
Figure 10B:
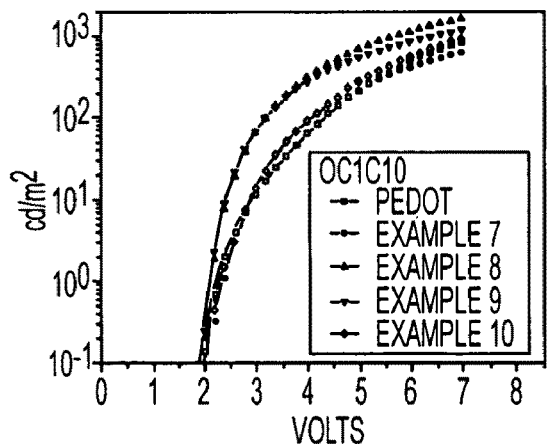
Figure 10C:
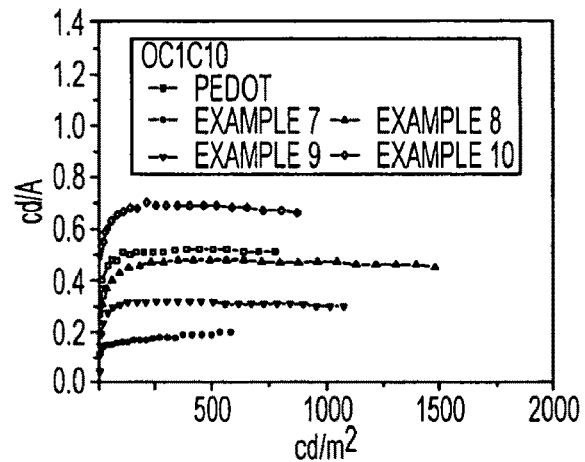

Similarly, OLED devices are known in the art as illustrated in for example FIG. 9. The devices can comprise, for example, multi-layer structures including for example an anode such as ITO on glass or PET or PEN; a hole injection layer; an electroluminescent layer such as a polymer layer; a conditioning layer such as LiF, and a cathode such as for example Ca, Al, or Ba.

Methods known in the art can be used to fabricate devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," Angew. Chem. Int. Ed., 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g., AlQ3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis (2-methyl-8-hydroxyquinolinato) aluminum; (v) bis(hydroxybenzoquinolinato) beryllium (BeQ.sub.2); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode in 2) Hole extraction layer in OPV:
3) Channel material in transistors
4) Channel material in circuits comprising a combination of transistors such as logic gates
5) Electrode material in transistors
6) Gate layer in a capacitor
7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. Nos. 5,454,880 (Univ. Cal.); 6,812,399; and 6,933,436.

Common electrode materials and substrates, as well as encapsulating materials can be used.

OLED Measurements

Methods known in the art can be used to measure OLED parameters. For example, measurements can be carried out at 10 mA/cm$^2$.

Voltage can be for example about 2 to about 8, or about 3 to about 7 including for example about 2 to about 5.

Brightness can be, for example, at least 250 cd/m$^2$, or at least 500 cd/m$^2$, or at least 750 cd/m$^2$, or at least 1,000 cd/m$^2$.

Efficiency can be, for example, at least 0.25 Cd/A, or at least 0.45 Cd/A, or at least 0.60 Cd/A, or at least 0.70 Cd/A, or at least 1.00 Cd/A, or at least 2.5 Cd/A, or at least 5.00 Cd/A, or at least 7.50 Cd/A, or at least 10.00 Cd/A.

Lifetime can be measured at 50 mA/cm$^2$ in hours and can be, for example, at least 50 hours, or at least 100 hours, or at least about 900 hours, or at least 1,000 hours, or at least 1100 hours, or at least 2,000 hours, or at least 5,000 hours.

Combinations of brightness, efficiency, and lifetime can be achieved. For example, brightness can be at least 1,000 cd/m2, efficiency can be at least 1.00 Cd/A, and lifetime can be at least 1,000 hours, at least 2,500 hours, or at least 5,000 hours.

OPV Measurements

Methods known in the art can be used to measure OPV parameters.

$J_{SC}$ values (mA/cm$^2$) can be for example at least 6, or at least 7, or at least 8, or at least 9, or at least 10, or at least 11, or at least 12. The values can be for example about 5 to about 12, or about 5 to about 15, or about 5 to about 20.

$V_{OC}$ values (V) can be for example at least about 0.5, or at least about 0.6, or at least about 0.7, or at least about 0.8, or at least about 0.9, or at least about 1.0, including for example about 0.5 to about 1.0, or about 0.55 to about 0.65.

FF values can for example at least about 0.2, or at least about 0.3, or at least about 0.4, or at least about 0.5, or at least about 0.6, or at least about 0.7, including also for example about 0.5 to about 0.8, or about 0.5 to about 0.73.

E (%) values can be for example at least about 1%, or at least about 2%, or at least about 3%, or at least about 4%, or at least about 5%, or at least about 6%, or at least about 7%, including for example about 1% to about 8%, or about 1% to about 7%, or about 1% to about 6%, or about 1% to about 5%, or about 1% to about 3.4%, or about 2% to about 3.4%.

Sulfonated polymers and formulations thereof as described herein can be made into an ink that can be used to produce high-performance hole-extraction layer for organic photovoltaic devices. For example, the efficiency of 3.38% in the working examples was essentially the same as the Baytron A14083 control device in the same fabrication run. HIL layers can conduct holes and mediate hole-extraction as well as current incumbent materials.

Control materials can be formulated such as PEDOT materials described in U.S. Pat. No. 4,959,430 to Jonas et al. Baytron materials can be obtained from H. C. Stark. Carbazole compounds are described in for example WO 2004/072205 to Brunner et al.

Figure 16:
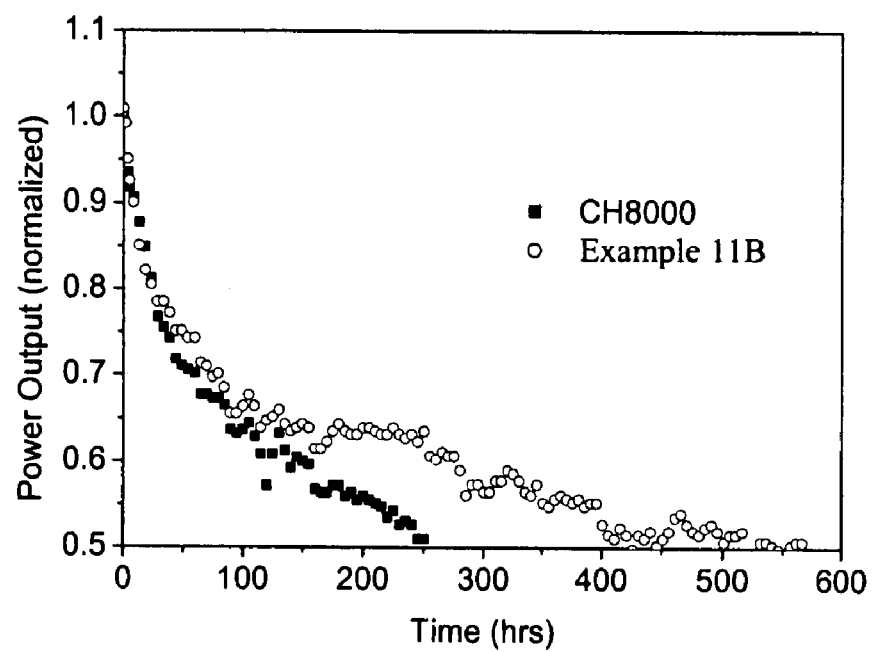
FIG. 16 illustrates degradation of power output of organic photovoltaic cells.

Degradation rate can be also examined (see for example FIG. 16). Degradation time until normalized power output is zero for a cell substantially similar to that of FIG. 16 and for the conditions described therefore can be for example at least 250 hours, or at least 300 hours, or at least 400 hours, or at least 500 hours.

Other types of devices which interact with light and or electricity/electric fields can be fabricated including sensors and transistors including field effect transistors (e.g., as electrodes or as active channel material, e.g., for use in logic circuits and other electronic circuitry). In particular, pH sensors, or sensors which are sensitive to detection of compounds which have functionalities which can bind to acid can be made and used in for example an optical sensing tool. Other device applications include for example supercapacitors (e.g., light weight power sources functioning as storage media with good charge capacity), cation transducers (e.g., devices featuring a cation binding event causing an optical or electrical signal), drug release (e.g., drugs with ionic functionalities can be bound to the polymer and a redox chemistry can trigger the release of the drug into the body; or an embedded microchip with the polymer can help trigger the release of the drug into the body by changing the doping profile), electrochromics, actuators (e.g., electrochemical doping/de-doping also can change the volume of the polymer which is the basis for actuating mechanism. Applications based on this can involve artificial muscles activated by electrical pulse, or also smart membranes with tunable pore size for purification of solvents), transparent electrodes to replace for example ITO, and membranes.

Additional description for applications is provided:

For electrochromics applications and devices, including mirrors, see for example Argun et al., Adv. Mater. 2003, 15, 1338-1341 (all polymeric electrochromic devices). For example, the sulfonated polymer exhibits very good stability in the oxidized form (i.e., very clear in the visible region). Mirrors with good stability in the clear state can be made. Only when a car with intense head-lamps approaches will the mirrors will be activated to become dark. If the polymer can return to its oxidized form by itself it can be very advantageous as it will require no power to return its normal state. Since it absorbs strongly, through the NIR (which is the heating radiation) windows coated with this polymer can potentially keep rooms cooler at the same time allowing light to penetrate into the building, spacecrafts etc., potentially minimizing the load on the ACs and lights.

For sensors, change in conductivity, charge transport properties, and/or optical properties can be made to occur due to specific interactions of material to be sensed with the HIL formulation; the signal can be detected in sensors.

For photovoltaics, see for example Zhang et al. (polymer photovoltaic cells with conducting polymer anodes) Adv. Mater. 2002, 14, 662-665.

For speakers: see for example Lee, et al. (Flexible and transparent organic film speaker by using highly conducting PEDOT/PSS as electrode), Synth. Met. 2003, 139, 457-461.

Electrostatic Dissipation Applications

Electrostatic dissipation coatings are described in for example U.S. provisional application Ser. No. 60/760,386 filed Jan. 20, 2006 to Greco et al. (see also PCT application PCT/US2007/001245 filed Jan. 18, 2007), which are each hereby incorporated by reference in their entirety including figures, claims, and working examples.

In one embodiment, regioregular polythiophene compositions as described and claimed herein are employed in or as electrostatic dissipation (ESD) coatings, packaging materials, and other forms and applications. Electrostatic discharge is a common problem in many applications including electronic devices which are becoming smaller and more intricate. To combat this undesired event, conductive coatings, also known as ESD coatings, can be used to coat numerous devices and device components. Conductive materials can be also blended into other materials such as polymers to form blends and packaging materials. The regioregular polythiophenes or polymers comprising regioregular polythiophenes described herein may be used as the only polymeric component of an ESD coating or be combined (i.e. blended) with one or more polymers which do not comprise regioregular polythiophenes. Furthermore, the regioregular polythiophenes can be a homopolymer, a copolymer or a block copolymer.

A non-limiting example of this embodiment involves a device comprising an electrostatic dissipation (ESD) coating, said ESD coating comprising at least one water soluble or water dispersible polymer comprising regioregular polythiophene comprising: at least one organic substituent; and at least one sulfonated substituent comprising sulfur bonding directly to the polythiophene backbone. In another embodiment, provided is an ESD packaging material.

In another embodiment, the coating may be a blend of one or more polymers wherein at least one comprises regioregular polythiophene. Further, in addition to one polymer comprising regioregular polythiophene, the ESD coating can comprise at least one polymer without regioregular polythiophene. In these ESD coatings, where a polymeric blend is used, the polymers are preferably compatible.

The molecular weight of the polymers in the coating can vary. In general, for example, the number average molecular weight of the polymer comprising regioregular polythiophene, the polymer without regioregular polythiophene, or both can be between about 5,000 and about 50,000. If desired, the number average molecular weight of the polymer without regioregular polythiophene can be for example about 5,000 to about 10,000,000, or about 5,000 to about 1,000,000.

In any of the aforementioned ESD coatings, at least one polymer may be cross-linked for various reasons such as improved chemical, mechanical or electrical properties.

Regioregularity of the polythiophene may be, for example, at least about 85%, or at least about 95%, or at least about 98%. In some embodiments, the degree of regioregularity can be at least about 70%, or at least about 80%. For example, in some instances, including some ESD applications, cost may be important and the highest levels of regioregularity may not be needed to achieve the performance. The ESD coating also preferably contains less that about 50 wt. %, or less than about 30 wt. % regioregular polythiophene polymer. The minimum amount of the polymer can be for example about 0.1 wt. % or about 1 wt. % or about 10 wt. %.

The polymer which does not comprise regioregular polythiophene can be a synthetic polymer and is not particularly limited. It can be for example thermoplastic. It can be a water soluble polymer or a polymer capable of aqueous based dispersion. Examples include organic polymers, synthetic polymers polymer or oligomer such as a polyvinyl polymer having a polymer side group, a poly(styrene) or a poly(styrene) derivative, poly(vinyl acetate) or its derivatives, poly(ethylene glycol) or its derivatives such as poly(ethylene-co-vinyl acetate), poly(pyrrolidone) or its derivatives such as poly(1-vinylpyrrolidone-co-vinyl acetate, poly(vinyl pyridine) or its derivatives, poly(methyl methacrylate) or its derivatives, poly (butyl acrylate) or its derivatives. More generally, it can comprise of polymers or oligomers built from monomers such as $CH_2CH$ Ar, where Ar=any aryl or functionalized aryl group, isocyanates, ethylene oxides, conjugated dienes, $CH_2CHRIR$ (where R1=alkyl, aryl, or alkyl/aryl functionality and R=H, alkyl, Cl, Br, F, OH, ester, acid, or ether), lactam, lactone, siloxanes, and ATRP macroinitiators. Preferred examples include poly(styrene) and poly(4-vinyl pyridine). Another example is a water-soluble or water-dispersable polyurethane.

For proper dissipation of static electricity the conductivity of the coating can be tuned. For example, the amount of conductive material can be increased or decreased. In addition, in some cases, doping can be used although the self-doping nature of the sulfonated polymer provides doping. Further doping may be achieved via organic, inorganic or ambient species and in forms of solids, liquids, gases, or a combination thereof. Oxidation is a useful method of enhancing electrical conductivity of polythiophenes. Useful halogen dopants include Br, I, Cl. Inorganic dopants include compounds that may be represented by iron trichloride, gold trichloride, arsenic pentafluoride, alkali metal salts of hypochlorite, protic acids such as benzenesulfonic acid and derivatives thereof, propionic acid, organic carboxylic and sulfonic acids, nitrosonium salts, $NOPF_6$ or $NOBF_4$, organic oxidants, tetracyanoquinone, dichlorodicyanoquinone, hypervalent iodine oxidants, iodosylbenzene, iodobenzene diacetate or a combination thereof. Including certain polymers in the blend can also lead to a doping effect in the polythiophenes. For instance, a polymer comprising an oxidative functionality, acidic functionality, poly(styrene sulfonic) acid or a combination thereof can be also included in the coating. Other compounds that provide a doping effect include: certain Lewis acids, iron trichloride, gold trichloride, and arsenic pentafluoride, protic organic acids, inorganic acids, benzenesulfonic acids and derivatives thereof, propionic acid, organic carboxylic acids, sulfonic acids, mineral acids, nitric acids, sulfuric acids, hydrochloric acids, tetracyanoquinone, dichlorodicyanoquinone, hypervalent iodine, iodosylbenzene, iodobenzene diacetate. Ambient doping typically occurs via species in the ambient air such as oxygen, carbon dioxide and moisture. The polymer comprising regioregular polythiophene is preferably doped sufficiently to provide an electronic conductivity in the material of at least about $10^{-1}$ siemens/cm (S/cm) or between about $10^{-13}$ siemens/cm to about $10^{-3}$ siemens/cm. The ESD coating preferably should retain efficacy over the lifetime of the device. Roughly, in certain cases it is desirable that the coating retain electronic conductivity of at least 1-13 for at least 1000 hrs.

In one example the regioregular polythiophene is doped with a quinone compound and the coating has a thickness of about 10 nm to about 100 nm, and wherein the polymer which does not comprise regioregular polythiophene comprises a polystyrene, a polystyrene derivative, a polyurethane, a polyacrylate, a polypyridine, or a polyvinyl phenol.

Application of the ESD coating can be achieved via spin coating, ink jetting, roll coating, gravure printing, dip coating, zone casting, or a combination thereof. Normally the applied coating is greater than 10 nm in thickness. Often, the coating is applied to insulating surfaces such as glass, silica, polymer or any others where static charge builds up. Additionally, the conductive polymer can be blended into materials used to fabricate packaging film used for protection of for example sensitive electronic equipment. This may be achieved by typical processing methodologies such as for example blown film extrusion. Optical properties of the finished coating can vary tremendously depending on the type of blend and percent ratio of the polythiophene polymers. Preferably, transparency of the coating is at least 90% over the wavelength region of 300 nm to 800 nm n.

The ESD coatings can be applied to a wide variety of devices requiring static charge dissipation. Non-limiting examples include: semiconductor devices and components, integrated circuits, display screens, projectors, aircraft wide screens, vehicular wide screens or CRT screens.

In one embodiment, an ESD coating is formulated from an aqueous solution of sulfonated conducting polymer. The pH can be adjusted to about neutral with a basic compound such as an amine. Water as well as an aqueous solution of a second polymer can be added. A non-aqueous solvent can be used to improve dispersion. See working example below. The weight percentage of conducting polymer such as sulfonated polythiophene in the final solids can be for example about 2 wt. % to about 30 wt. %, or about 5 wt. % to about 20 wt. %. Water content in the solution before removal of solvent can be for example about 40 wt. % to about 80 wt. % in solution.

In addition, the sulfonated polymers described herein can be used in transparent electrode applications.

WORKING EXAMPLES

Further description is also provided by way of the following non-limiting working examples.

Working Example 1

Synthesis by Sulfuric Acid

Preparation of sulfonated poly(3-(methoxyethoxyethoxy)thiophene-2,5-diyl) (P3MEET-S, or MPX)

6.02 g of neutral poly(3-(methoxyethoxyethoxy) thiophene-2,5-diyl) (Mw=15,000; PDI=1.4) was stirred at 80-85° C. in 180 mL fuming sulfuric acid (Acros) for 24 hours and added to 6 L de-ionized water. The aqueous dispersion was stirred for an hour and centrifuged. The clear supernatant was removed and 800 mL fresh de-ionized water was added to the centrifugate, shaken vigorously and centrifuged again. The clear supernatant was removed and the process was repeated two more times. The wet polymer was diluted with de-ionized water to make the total solids content between 0.5 and 1% and sonicated for 30 min. The suspension was then passed in 2 lots through a glass column (1" diameter) packed with 30 g of fresh Amberjet 4400 (OH form, Aldrich) ion-exchange resin, for each lot. This process removed any residual free sulfuric acid. The aqueous suspension of the sulfonated polymer thus obtained did not show any aggregation or precipitation even after several days of storage under ambient conditions at these concentrations.

The acid equivalent was determined to be 74.4 mg NaOH per gram of sulfonated polymer. Elemental analysis (CHS) of the polymer was done at Galbraith Laboratories Inc. and the CHS content was determined to be 43.22, 3.37 and 23.44% by weight, respectively. Based on the C/S ratio, the sulfonation level was determined to be 83%.

See FIGS. 1 and 2.

Working Example 2

Synthesis of Another Polythiophene

Sulfonation of poly(3-(ethyloxyethoxyethoxyethoxy) thiophene-2,5-diyl)

Sulfonated poly(3-(ethyloxyethoxyethoxyethoxy) thiophene-2,5-diyl) was prepared using a similar procedure as shown in example 2. UV-Vis-NIR spectra resembles that of for the polymer of Example 1 characterized by a strong absorbance throughout the NIR region indicative of a bipolaronic character.

Working Example 3

Synthesis by Alternative Reagent

Sulfonation of poly(3-(methyloxyethoxyethoxy)thiophene-2,5-diyl)

Alternatively, sulfonation can also be carried out by dissolving poly(3-(methyloxyethoxyethoxy)thiophene-2,5-diyl) in chloroform and adding acetyl sulfate reagent prepared in situ in anhydrous 1,2-dichloroethane as reported by Makoski H. S, and Lundberg, R. U.S. Pat. No. 3,870,841, 1975. 1.0 gm poly(3-(methyloxyethoxyethoxy)thiophene-2,5-diyl) was heated to reflux with 50 mL chloroform. To this solution 3.4 mL of acetyl sulfate (1 eq) reagent was added. The reaction mixture was refluxed for 27 h and added to 200 mL methanol, followed by filtering, washing with de-ionized water to neutral pH and finally with methanol before drying to a fine powder.

Working Example 4

Synthesis with Ion Exchange

Tetra-n-butylammonium salt of P3MEET-S was prepared by adding 42.3 mg of n-Bu$_4$NOH.30H$_2$O to 5.027 g of 0.6% aqueous P3MEET-S. This represents 0.95 eq of free acid based on previous titration results, see Example 1. pH of the solution was measured to be 4.30 after adding the n-Bu$_4$NOH.30H$_2$O (called T1). pH of as prepared P3MEET-S was 3.165. Similarly, another solution with 88.8 mg n-Bu$_4$NOH.30H$_2$O was added to 5.002 g of 0.6% aqueous P3MEET-S. pH of this solution was measured to be 11.2 (called T2).

See FIG. 3.

Working Example 5

Synthesis of Bisthiophene Polymer

Sulfonation of poly(3,3'-bis-[2-(2-methoxy-ethoxy)-ethoxy]-[2,2']bithiophene-5,5'-diyl))

Poly(3,3'-bis-[2-(2-methoxy-ethoxy)-ethoxy]-[2,2'] bithiophene-5,5'-diyl)) was prepared using a similar procedures as shown in example 1. See FIG. 4.

Synthesis of 3,3'-bis-[2-(2-methoxy-ethoxy)-ethoxy]-[2,2']bithiophene 3,3'-bis-[2-(2-methoxy-ethoxy)-ethoxy]-[2,2'] bithiophene was prepared by a procedure adopted from the preparation of 2,2''-Bis(3,4-ethylenedioxythiophene) (BiEDOT) reported by Sotzing et al (*Adv. Mater.* 1997, 9, 795). 3-[2-(2-Methoxy-ethoxy)-ethoxy]-thiophene was lithiated at −78° C. followed by coupling using anhydrous $CuCl_2$. The final product was isolated via column chromatography using 1:1 (v/v) ethyl acetate/hexanes as the eluent. $^1$H-NMR ($CDCl_3$, δ ppm):

Synthesis of poly(3,3'-bis-[2-(2-methoxy-ethoxy)-ethoxy]-[2,2']bithiophene-5,5'-diyl)

2.5 gms of 3,3'-bis-[2-(2-methoxy-ethoxy)-ethoxy]-[2,2'] bithiophene dissolved in 25 mL chloroform was added to a 1 L three-neck RBF. To this solution 2.5 gms of $FeCl_3$ (2.5 eq) dissolved in 350 mL chloroform was added dropwise over 2.5 hrs. The reaction mixture was stirred at room temperature for 14 hours. The oxidized polymer solids were filtered, and stirred in 200 mL 9:1 (v/v) MeOH+Conc.HCl for 1 h. The next step was to filter and repeat process to remove any free iron salts. The solids (~2 gms) were added to 100 mL chloroform followed by 15 mL of aqueous solution of hydrazine (35 wt %). Reflux was carried out for 30 min. Addition of hydrazine caused the polymer to dissolve in chloroform. The solution was poured into 1 L methanol+100 mL water, and stirred for an hour and filtered. The filtered solids were stirred in 150 mL water at 50° C. for 1 h and filtered. The solids were added to 180 mL water plus 10 mL Conc. HCl and heated for 1 h at 50° C., filtered and dried in oven at RT for 2 days. Conductivities of iodine doped 337 nm thick drop cast films were measured to be 1 $Scm^{-1}$. GPC analysis using chloroform as eluent and a UV-vis detector (k=420 nm) gave a Mn=12707 (PDI=5).

Working Example 6

Characterization of Films

6A. FIG. 5 shows the Vis-NIR spectrum of a doped film of the sulfonated poly(3-(methoxyethoxyethoxy)thiophene-2,5-diyl) spin-coated onto glass plates. The films were annealed at 150° C. for 15 min after spin coating. These films exhibited very strong absorbance extending into the NIR region, typical of oxidized conjugated polymers. The spectrum underwent little/no change even after 7 days of storage under ambient conditions demonstrating the excellent stability in the oxidized form.

6B. FIG. 6 shows spectra of thin films prepared by spinning the above solutions of T1 and T2 onto a glass plate (form working example 4). The films were annealed at 150° C. for 10 min before obtaining the spectra.

Working Examples 7-11

Formulations

Example 7

A solution of Plexcore MPX in water (about 0.61% by weight) was prepared as described above in Example 1. This solution (4.92 g) was added to a vial along with water (4.81 g) and placed in an ultrasonic bath for 30 minutes. Poly(4-vinylphenol) (0.27 g) was dissolved in 2-butoxyethanol (6.00 g) and heated with stirring until the polymer dissolved completely. The two solutions were then combined and mixed thoroughly. The solution was then passed through a 0.22 micron PVDF syringe filter (Millipore).

Examples 8 and 9

The procedure was similar to that of Example 7 except that an aqueous dispersion of polystyrenesulfonic acid (PSS) was added after the addition of poly(4-vinylphenol).

Example 10

The procedure was similar to that of Example 7 except that PSS was added in place of the poly(4-vinylphenol).

Example 11A

The procedure is identical to Example 7 except that an aqueous dispersion of NeoRez R-966 (an aliphatic urethane dispersion from Avecia) was added in place of the poly(4-vinylphenol) (PUD is polyurethane dispersion).

Example 11B

The procedure is identical to Example 7 except that Nafion® perfluorinated ion-exchange resin (10% dispersion) was added after the addition of poly(4-vinylphenol). See also Example 1° C. for use of Nafion®.

| Example | Water | 2-Butoxy-ethanol | Plexcore MPX | Poly(4-vinyl phenol) | PSS | Nafion | PUD |
|---------|-------|------------------|--------------|----------------------|-----|--------|-----|
| 7       | 9.70  | 6.00             | 0.030        | 0.272                | —   | —      | —   |
| 8       | 9.63  | 6.00             | 0.030        | 0.256                | 0.015 | —    | —   |
| 9       | 9.63  | 6.00             | 0.045        | 0.241                | 0.015 | —    | —   |
| 10      | 9.63  | 6.00             | 0.015        | —                    | 0.286 | —    | —   |
| 11A     | 8.40  | 0.93             | 0.030        | —                    | —   | —      | 0.64 |
| 11B     | 8.07  | 6.60             | 0.019        | 0.294                | —   | 0.017  | —   |
| 11C     | 6.84  | 7.78             | 0.020        | 0.297                | 0.0124 | 0.001 | —  |

Additional formulations were made as follows:

| | ICP Polymer | Synthetic polymer 1 PV4P | Synthetic polymer 2 PSS | Synthetic polymer 3 NAFION | Solvent 1 | Solvent 2 |
|---|---|---|---|---|---|---|
| 11D | 6 | 89 | 5 | 0 | Water (55) | Butyl cellosolve (45) |
| 11E | 6 | 89 | 0 | 5 | Water (55) | Butyl cellosolve (45) |
| 11F | 6 | 92 | 1 | 1 | Water (55) | Butyl cellosolve (45) |

Examples 12-14

Photovoltaic Device

The device fabrication described below is intended as an illustrative example and does not in any way imply the limitation of the invention to the said fabrication process, device architecture (sequence, number of layers etc.) or materials other than the HIL materials claimed in this invention.

The OPV devices described herein were fabricated on indium tin oxide (ITO) surfaces deposited on glass substrates. The ITO surface was pre-patterned to define the pixel area of 0.9 cm$^2$. The device substrates were cleaned by ultrasonication in a dilute soap solution, followed by distilled water for 20 minutes each. This was followed by ultrasonication in isopropanol. The substrates were dried under nitrogen flow, following which they were treated in a UV-Ozone chamber operating at 300 W for 20 minutes.

The cleaned substrates were then coated with the hole collection layer. The coating process was done on a spin coater but can be similarly achieved with spray coating, ink-jetting, contact printing or any other deposition method capable of resulting in an HCL film of the desired thickness. An HIL ink (from Examples 7, 8, or 9) was spin-coated and then dried at 175° C. for 30 minutes resulting in a 170 nm thick layer. The active layer (a 2:1 weight ratio blend of P3HT/PCBM (methanofullerene [6,6]-phenyl C61-butyric acid methyl ester) was applied by spin coating in a nitrogen atmosphere and annealed at 175° C. for 30 minutes resulting in a 200 nm thick layer. This film was spun on top of the HIL film with no observable morphological damage to the HIL (independently verified by atomic force microscopy, AFM). The substrates were then transferred to a vacuum chamber in which, by means of physical vapor deposition, a cathode layer was deposited. In this example, the cathode layer was prepared by the sequential deposition of two metal layers, the first being a 5 nm layer of Ca (0.1 nm/sec) followed by a 200 nm layer of Al (0.5 nm/sec) with the base pressure at 5×10$^{-7}$ Torr.

The devices thus obtained were encapsulated with a glass cover slip to prevent exposure to ambient conditions by means of a UV-light curing epoxy resin cured at 80 W/cm$^2$ UV exposure 4 minutes.

Example 15

OPV Testing

The OPVs fabricated in this example are representative of the format they may be used in actual applications all of which are considered to be covered by this invention, limited only by the presence of the HIL disclosed herein being present in the device stack. The testing example as described below is used only to describe the evaluation of the OPV performance and is not considered to be the only methodology utilized to electrically address the OPV.

The OPVs comprise pixels on a glass substrate whose electrodes extend outside the encapsulated area of the device which contain the light harvesting portion of the pixels. The typical area of each pixel was 0.09 cm$^2$. The electrodes were contacted with a current source meter such as a Keithley 2400 source meter with a bias applied to the indium tin oxide electrode while the aluminum electrode is earthed. The device was then held under the plane wave front of an Oriel 300 W Solar simulator equipped with a Xenon lamp at a distance of 20 cm from the optics of the Solar simulator. The optical power of the light incident on the pixel was 100 mW/cm$^2$, while the actual spectrum of the light generated by the Solar simulator approximates the light generated by the Sun, which corresponds to the standard Air Mass 1.5 Global Filter or AM 1.5 G spectrum.

The pixel thus illuminated absorbs light and generates photocurrent. This photocurrent comprises positive charges (holes) and negative charges (electrons) which are collected by the electrodes depending on the electrically applied bias. This photocurrent was in turn read by the Keithley 2400 source meter. Thus the generated photocurrent was measured as a function of the voltage applied to the pixel. The short circuit current (the current generated under illumination at zero volts bias) is indicative of the efficiency with which holes are extracted by the hole extraction layer. Besides this, the open circuit voltage and the fill factor together with the short circuit current determine the overall efficiency of the device.

Figure 8:
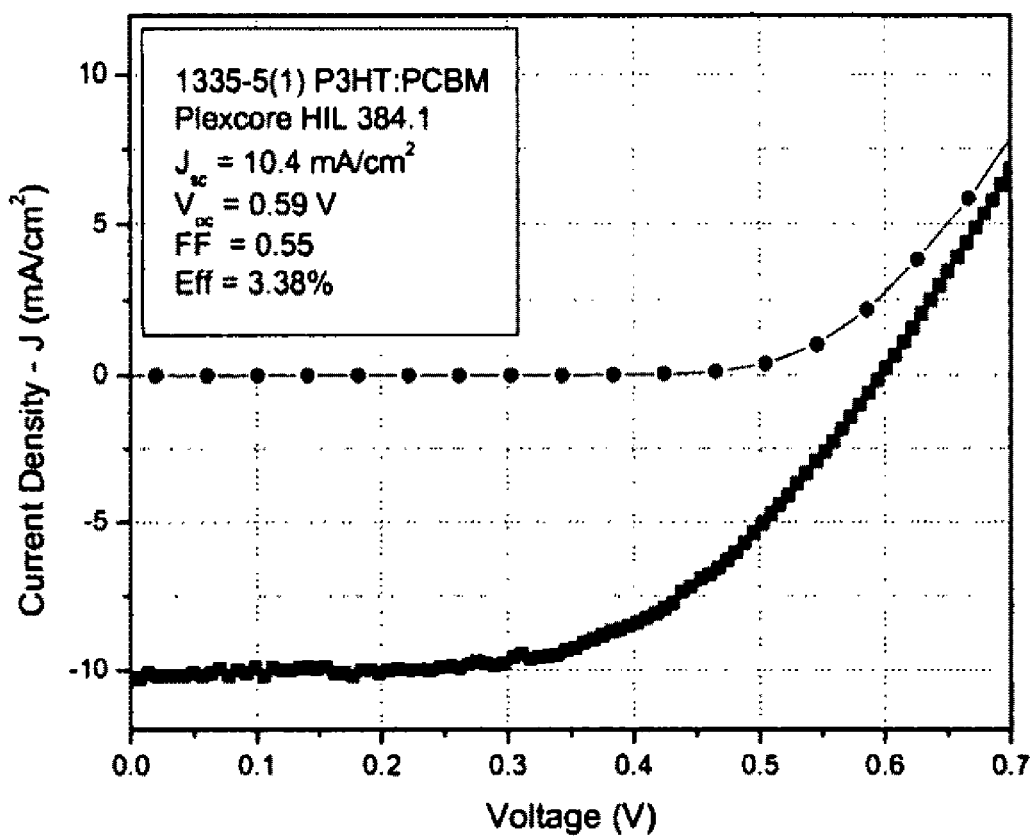
FIG. 8 provides OPV data.

FIG. 7 illustrates a typical conductive polymer photovoltaic cell. FIG. 8 illustrates representative data. The following Table I provides additional data:

TABLE I

| | Jsc (mA/cm2) | Voc (V) | FF | E (%) |
|---|---|---|---|---|
| PEDOT | 10.84 | 0.60 | 0.55 | 3.59 |
| Example 7 | 9.59 | 0.59 | 0.24 | 1.38 |
| Example 8 | 9.72 | 0.59 | 0.38 | 2.14 |
| Example 9 | 10.34 | 0.59 | 0.55 | 3.38 |
| Example 10 | 6.72 | 0.59 | 0.29 | 1.16 |

The efficiency reported in FIG. 8 (3.38%) was essentially the same as the Baytron A14083 control device in the same fabrication run (the incumbent material).

FIG. 16 illustrates degradation of power output of organic photovoltaic cells made with CH8000 and Example 11B as the hole extraction layer. The devices are placed under a lamp generating 2 suns of light output and are operating at a temperature of 85° C.

Working Example

OLED Device Fabrication

The device fabrication described below is intended as an example and does not in any way imply the limitation of the invention to the said fabrication process, device architecture (sequence, number of layers etc.) or materials other than the HIL materials claimed in this invention.

The OLED devices described herein were fabricated on indium tin oxide (ITO) surfaces deposited on glass substrates. The ITO surface was pre-patterned to define the pixel area of 0.9 cm$^2$. The device substrates were cleaned by ultrasonication in a dilute soap solution followed by distilled water for 20 minutes each. This was followed by ultrasonication in isopropanol. The substrates were dried under nitrogen flow, following which they were treated in a UV-Ozone chamber operating at 300 W for 20 minutes.

The cleaned substrates were then coated with the hole injection layer and dried at 200° C. for 15 minutes (60 nm dry film thickness). The coating process was done on a spin coater but can be similarly achieved with spray coating, ink-jetting, contact printing or any other deposition method capable of resulting in an HIL film of the desired thickness. This was followed by the spin coating of the light emitting polymer (LEP) layer which was dried at 170° C. for 15 minutes (75 nm dry film thickness).

The substrates were then transferred to a vacuum chamber in which, by means of physical vapor deposition, a cathode layer was deposited. In this example, the cathode layer was prepared by the sequential deposition of two metal layers, the first being a 5 nm layer of Ca (or Ba) (0.1 nm/sec) followed by a 200 nm layer of Al (0.5 nm/sec) with the base pressure at 5×11$^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

Hybrid—SMOLED Device Fabrication:

The device fabrication described below is intended as an example and does not in any way imply the limitation of the invention to the said fabrication process, device architecture (sequence, number of layers etc.) or materials other than the HIL materials claimed in this invention.

The representative device is an example of hybrid device architecture involving a solution processed hole injection layer (HIL) and a vapor-deposited hole transport layer of N,N'-di(naphthalene-1-yl)-N,N'-diphenyl-benzidine (NPB) and electron transport layer (ETL) and emissive layer of tris(8-hydroxyquinolinato)aluminum (ALQ3) with pre-patterned ITO as anode and LiF and Al as cathode.

The hybrid SMOLED devices described herein were fabricated on indium tin oxide (ITO) surfaces deposited on glass substrates. The ITO surface was pre-patterned to define the pixel area of 0.9 cm$^2$. The device substrates were cleaned by ultrasonication in a dilute soap solution followed by distilled water for 20 minutes each. This was followed by ultrasonication in isopropanol. The substrates were dried under nitrogen flow, after which they were treated under a UV-Ozone chamber operating at 300 W for 20 minutes.

The cleaned substrates were then coated with the hole injection layer (HIL). The coating process was done on a spin coater but can easily be similarly achieved with spray coating, ink-jetting, contact printing or any other deposition method capable of resulting in an HIL film of the desired thickness.

The spin-coated HIL was annealed at 200° C. for 15 minutes in an inert glove box environment resulting in a 60 nm film thickness.

The substrates were then transferred to a vacuum deposition chamber in which by means of physical thermal deposition the organic materials —NPB as hole transport layer and ALQ3 as electron transport and emissive layer—were deposited. The thickness of 70 nm was achieved for both NPB and ALQ3 layers respectively. This was followed by deposition of the cathode in the form of a sequential deposition of two metal layers, the first being the LiF layer of 0.5 nm thickness followed by a 200 nm layer of Al. The following Table summarizes the deposition parameters for the device fabrication:

| Typical base pressure at start of the run: 5.0 × 10$^{-7}$ torr | | |
|---|---|---|
| Material | Deposition Rate* (nm/Sec) | Final Thickness (nm) |
| NPB | 0.46-0.48 | 70 |
| ALQ3 | 0.41-0.55 | 70 |
| LiF | 0.02-0.03 | 0.5 |
| Al | 0.4-0.6 | 200 |

*Typical Range

The devices thus obtained were encapsulated with a glass cover slip to prevent exposure to ambient conditions by means of a UV-light curing epoxy resin cured at 80 W/cm$^2$ UV exposure for 4 minutes.

Device Testing (OLED/SMOLED):

The OLEDs fabricated in this example are representative of the format they may be used in actual applications all of which are considered to be covered by this invention, limited only by the presence of the HIL disclosed herein being present in the device stack. The testing example as described below is used only to describe the evaluation of the OLED performance and is not considered to be the only methodology utilized to electrically address the OLEDs.

The OLEDs comprise pixels on a glass substrate whose electrodes extend outside the encapsulated area of the device which contain the light emitting portion of the pixels. The typical area of each pixel is 0.09 cm$^2$. The electrodes are contacted with a current source meter such as a Keithley 2400 source meter with a bias applied to the indium tin oxide electrode while the aluminum electrode is earthed. This results in positively charged carriers (holes) and negatively charged carriers being injected into the device which form excitons and generate light. In this example, the HIL assists the injection of charge carriers into the light emitting layer. This results in a low operating voltage of the device (defined as the voltage required to run a given current density through the pixel).

Simultaneously, another Keithley 2400 source meter is used to address a large area silicon photodiode. This photodiode is maintained at zero volts bias by the 2400 source meter. It is placed in direct contact with area of the glass substrate directly below the lighted area of the OLED pixel. The photodiode collects the light generated by the OLED converting them into photocurrent which is in turn read by the source meter. The photodiode current generated is quantified into optical units (candelas/sq. meter) by calibrating it with the help of a Minolta CS-200 Chromameter.

During the testing of the device, the Keithley 2400 addressing the OLED pixel applies a voltage sweep to it. The resultant current passing through the pixel is measured. At the same time the current passing through the OLED pixel results in light being generated which then results in a photocurrent reading by the other Keithley 2400 connected to the photodiode. Thus the voltage-current-light or IVL data for the pixel is generated. This in turn enables the measurement of other device characteristics such as the lumens per Watt of electrical input power to the pixel and candelas per ampere of pixel current.

FIG. 9 illustrates a schematic representation of an organic light emitting diode (OLED). Table II and FIGS. 10-14 provide device testing data.

The performance of different HILs in different example OLED types is described. Note that typically performance is quantified by a combination of different parameters such as operating voltage (should be low), brightness in nits (should be bright, luminous efficiency in units of cd/A (reflecting how much electric charge is needed to obtain light from the device) and the lifetime under operation (time required to reach half of the initial luminance value at the start of the test). As such, the overall performance is very important in a comparative evaluation of HIL performance. Below, the description is classified into different sections depending on device type being evaluated.

1) OC1C10: As observed from the data in FIG. 10, depending on the composition of HILs performance in voltage equal to that of PEDOT and in case of efficiency even exceeding PEDOT can be attained. Note that in these devices the efficiency is limited by the emitter and not the HIL being used. Brightness of the devices were as high as 1200 nits in case of Example 8 at 7V.

Figure 11A:
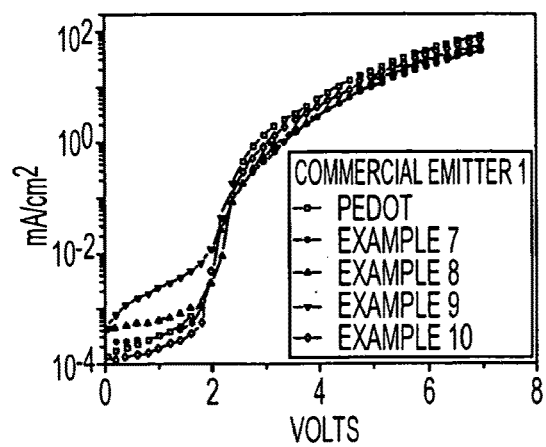
FIG. 11 illustrates device data indicative of HIL performance in Commercial Emitter 1
Figure 11B:
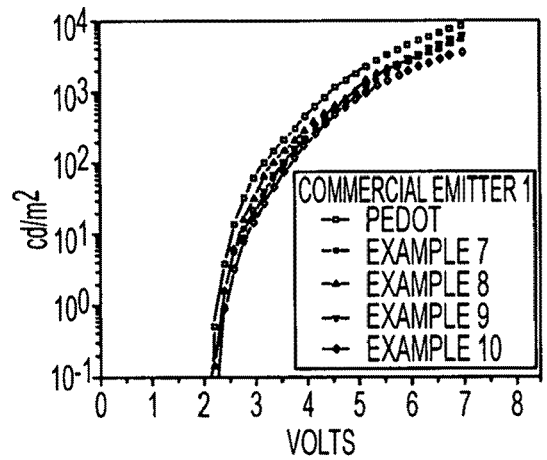
Figure 11C:
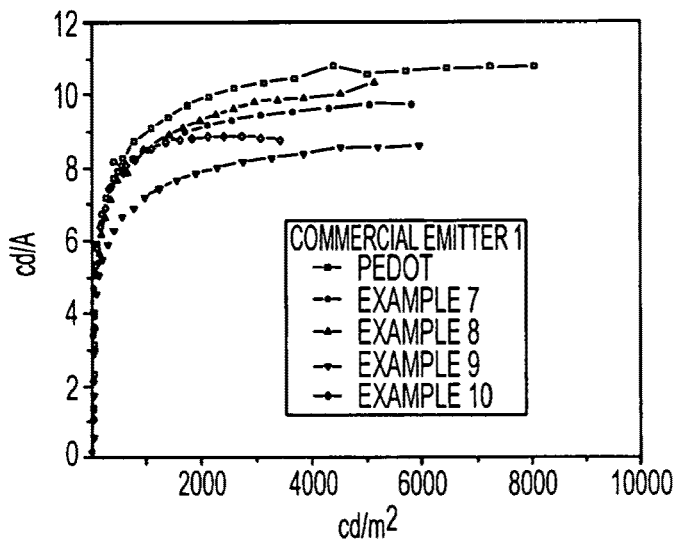

2) Commercial emitter 1: The emitter layer used in these devices has a much higher intrinsic ability to harvest light from charge carriers due to a high quantum efficiency. As a result, the efficiencies in this case are as high as 8-11 cd/A as shown in FIG. 11.

Figure 12A:
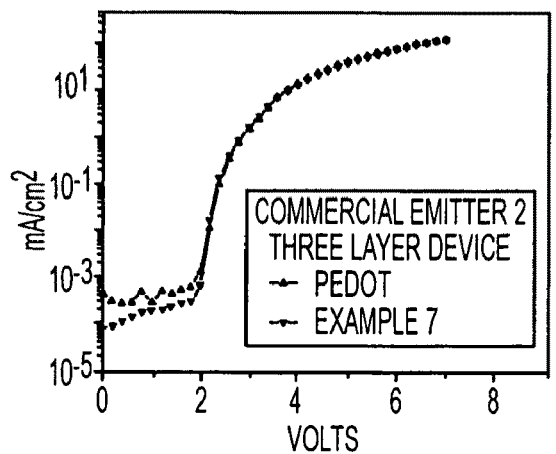
FIG. 12 illustrates device data indicative of HIL performance in Commercial Emitter 2
Figure 12B:
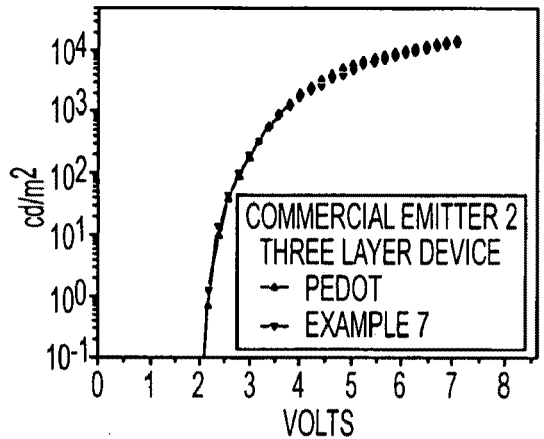
Figure 12C:
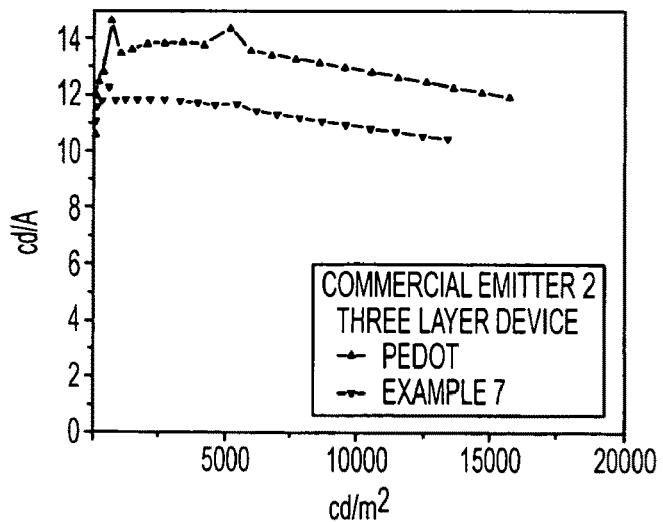

FIG. 12 also indicates that depending on composition both voltage and efficiency of example HILs discussed herein can be tuned to equal that of PEDOT.

3) Commercial emitter 2: In the case of commercial emitter 2 (FIG. 12) a three layer device architecture where an additional buffer layer is utilized between the HIL and the emissive layer is used as a test device architecture. As observed, the operating voltage, luminance and efficiencies for Example 7 are comparable to that of PEDOT.

Figure 13:
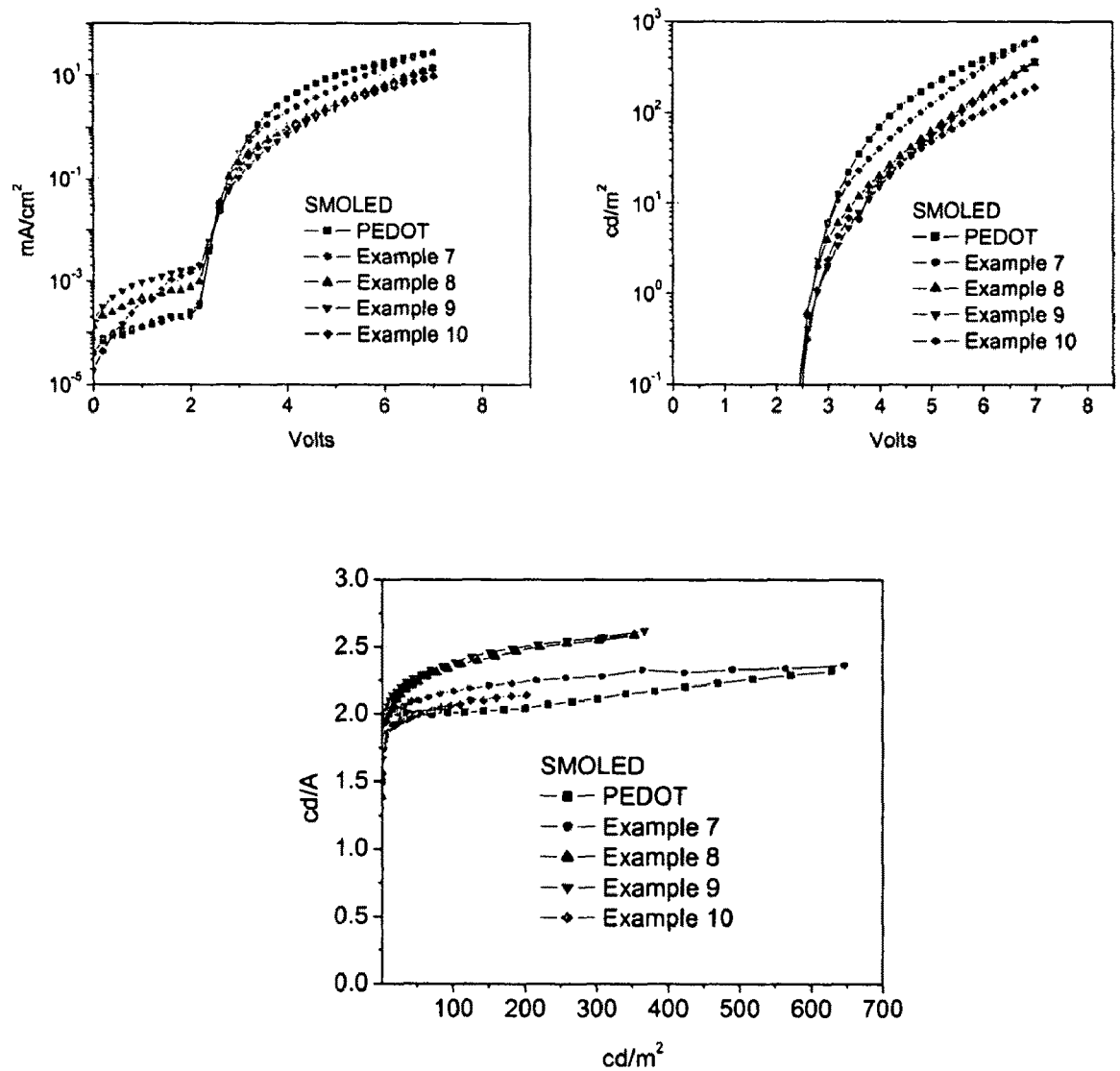
FIG. 13 illustrates device data indicative of HIL performance in SMOLED based hybrid devices.
Figure 14:
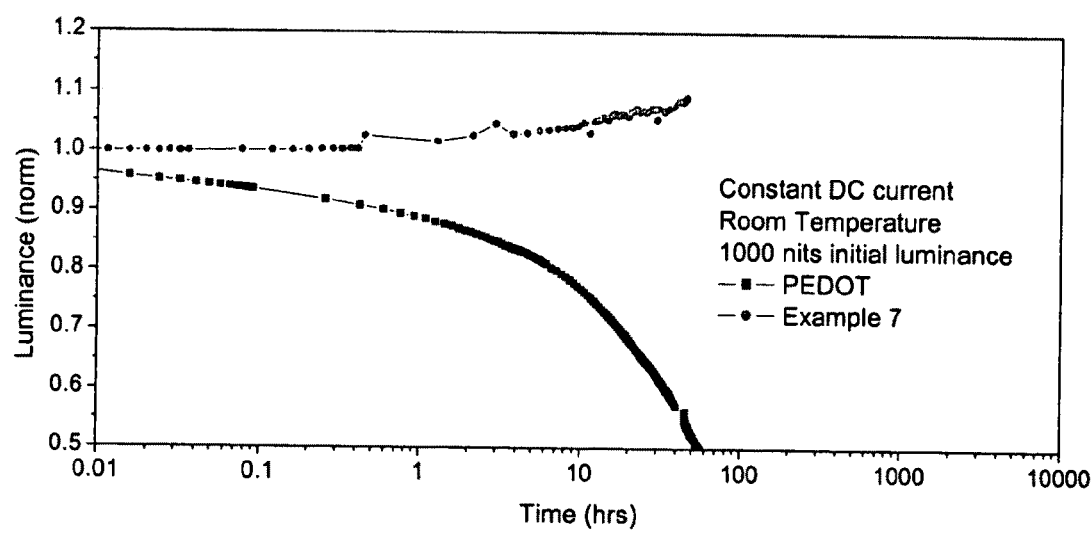
FIG. 14 illustrates lifetime data comparing PEDOT and HIL in SMOLED based hybrid devices.

4) SMOLED Devices: FIG. 13 provides a summary of the performance of different HILs in hybrid devices. The operating voltage of the example HILs compare quite well with that obtained for PEDOT. Furthermore as is evident from the efficiency data the performance of all example HILs exceeds that of PEDOT. The most important result which clearly demonstrated the superior performance of the Example HILs is depicted in FIG. 14. The graph shows the luminance decay over time as devices are stressed at a constant DC current from an initial luminance of 1000 nits. As observed, there is a dramatic difference in lifetime performance of Example 7 being used as an HIL compared to PEDOT. While PEDOT has a half life of not more than 50-60 hrs, the device with Example 7 as the HIL shows no loss of luminance on these time scales. As the device is tested for a longer time it is expected that the luminance will eventually decay. However, even with only 50 hours of data collected it is already apparent that the performance of Example 7 far exceeds that of PEDOT.

Figure 17A:
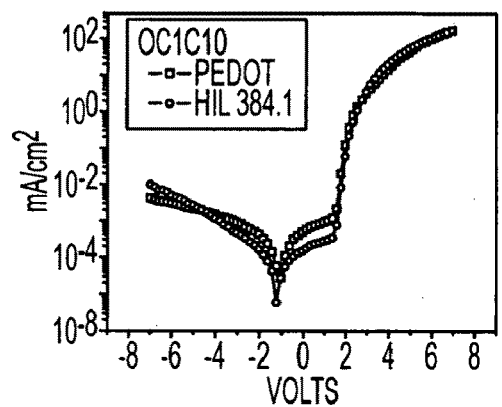
FIG. 17 illustrates current-voltage luminance performance.
Figure 17B:
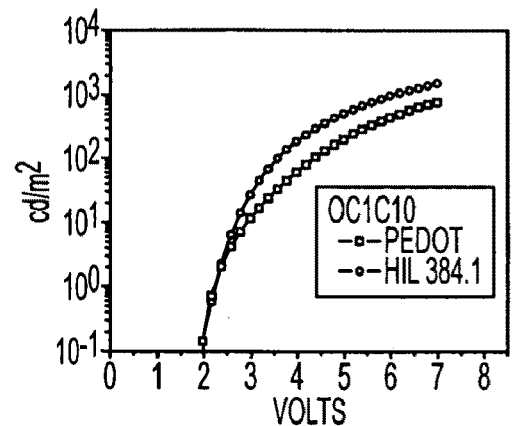
Figure 17C:
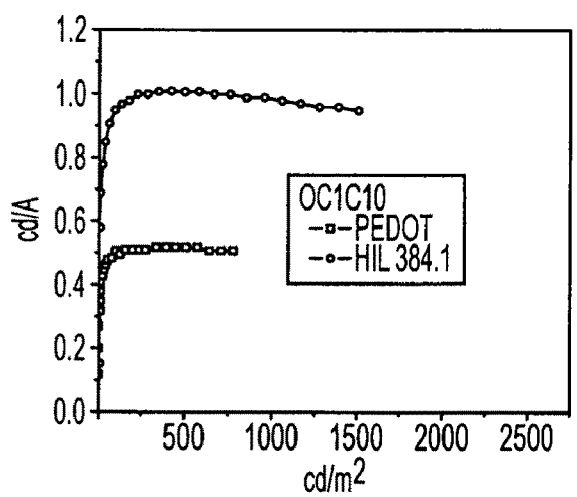

FIG. 17 illustrates current-voltage luminance performance for OC1C10 based OLED devices comparing PEDOT and HIL 384.1 as described herein. An improvement in efficiency is observed over PEDOT.

Figure 18A:
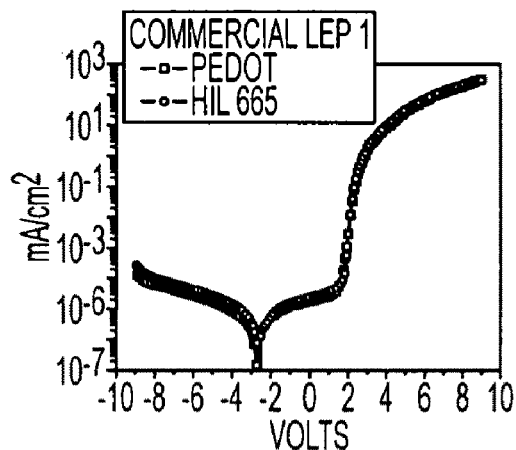
FIG. 18 illustrates current-voltage luminance performance.
Figure 18B:
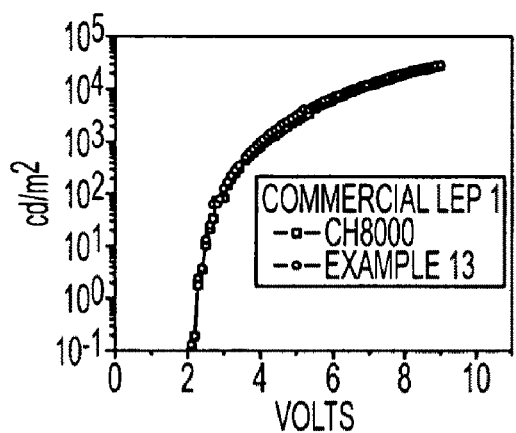
Figure 18C:
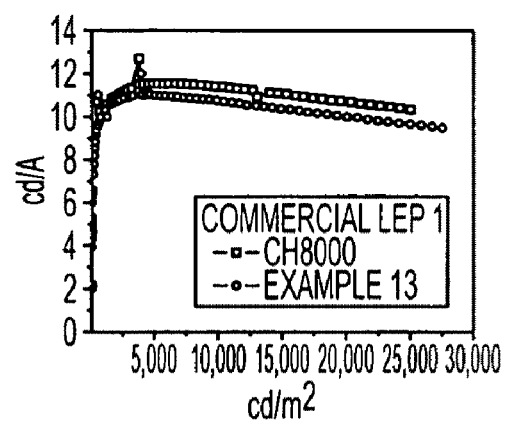

FIG. 18 illustrates current-voltage luminance performance for a commercial emitter 1 based OLED devices comparing CH8000 and Example 11C. Comparable performance to CH8000 is obtained for this HIL as evident from the data.

Figure 19:
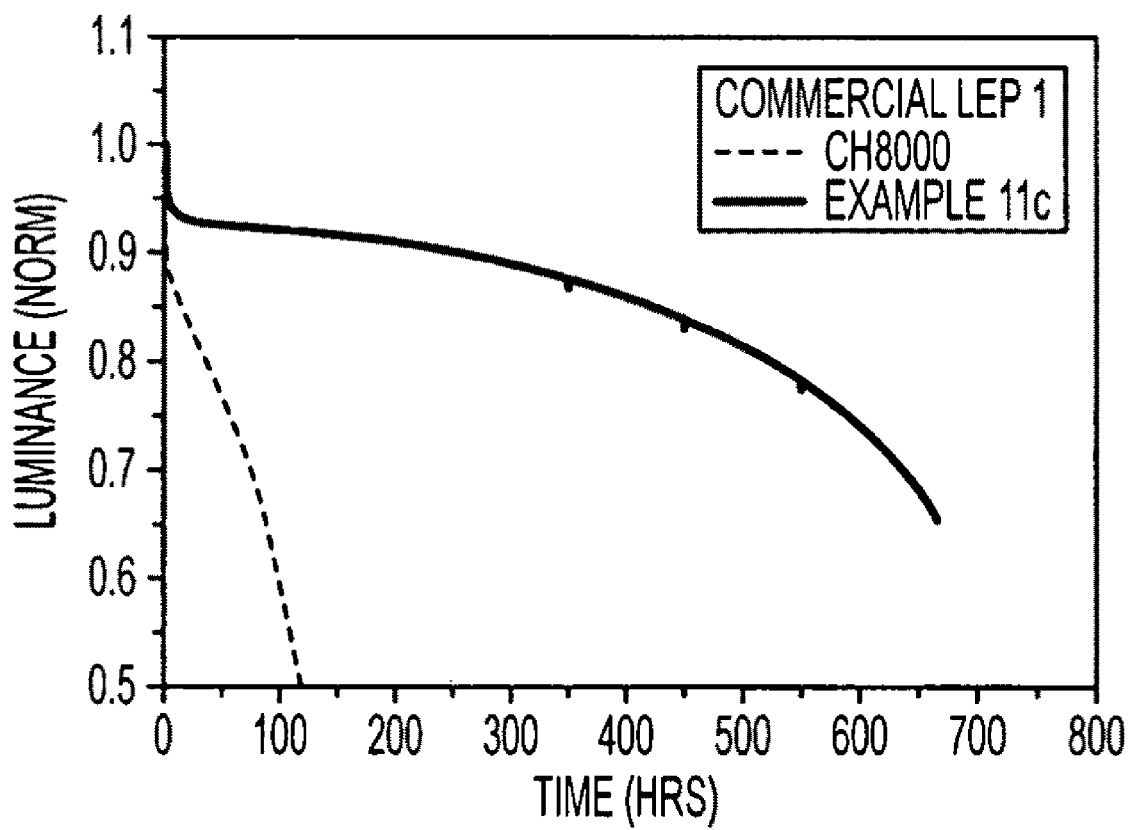
FIG. 19 illustrates luminance decay under passive matrix testing conditions.

FIG. 19 illustrates luminance decay under passive matrix testing conditions at 70 degrees Celsius for devices comprising a commercial emitter 1. Lifetime for the Example 11C containing device is observed to be better than for CH8000.

Figure 20A:
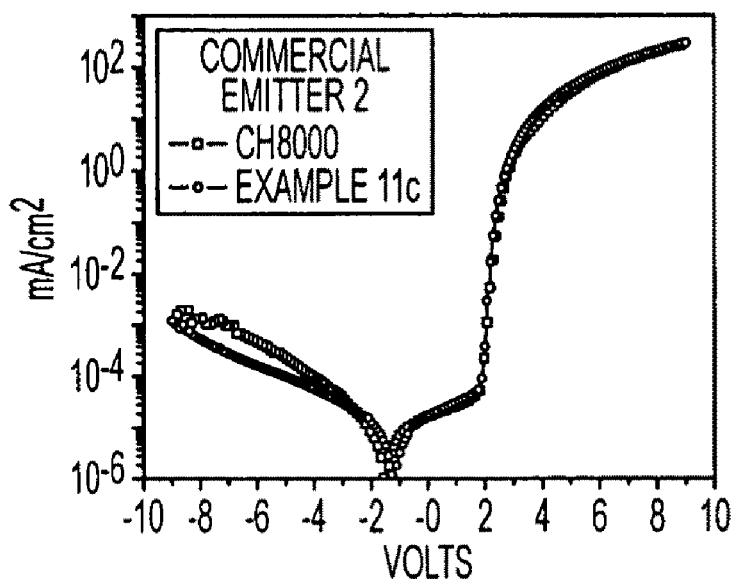
FIG. 20 illustrates current-voltage-luminance performance.
Figure 20B:
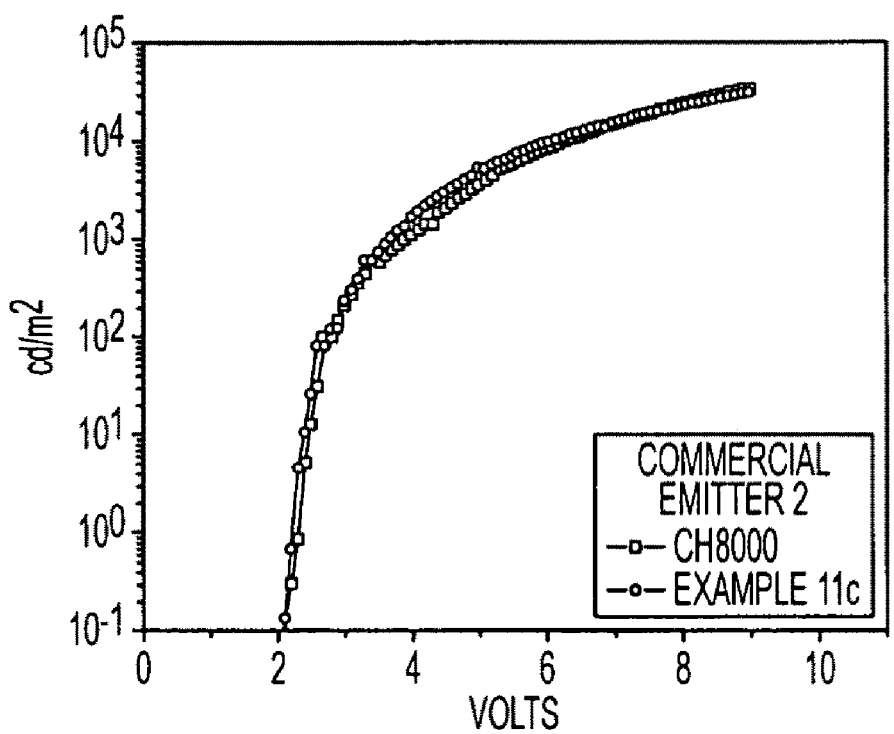
Figure 20C:
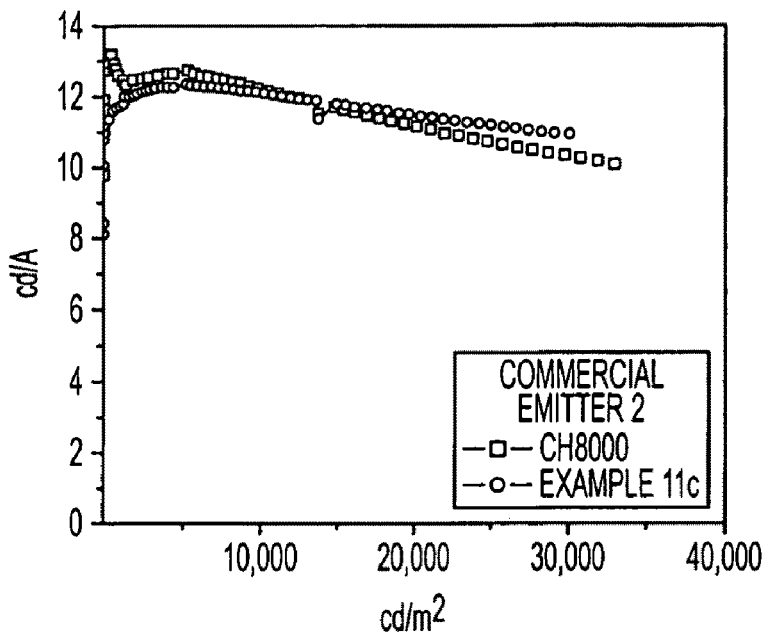

FIG. 20 illustrates current-voltage-luminance performance for commercial emitter 2 based OLED devices comparing CH8000 and Example 11C. Comparable performance to CH8000 is obtained for this HIL as evident from the data.

Figure 21:
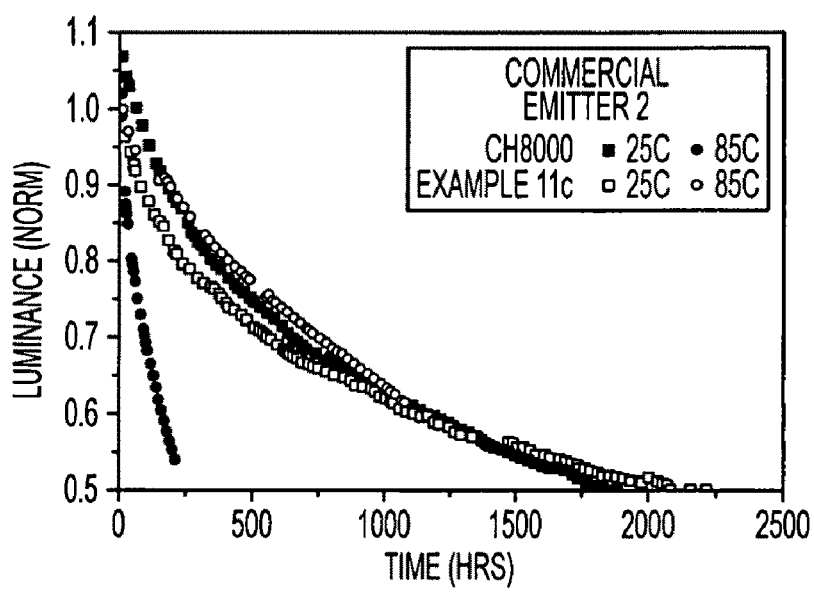
FIG. 21 illustrates luminance decay under passive matrix testing conditions.

FIG. 21 illustrates luminance decay under passive matrix testing conditions for devices comprising a commercial emitter 2. Lifetime for the HIL 665 device at room temperature is observed to be better than that for PEDOT. Even more dramatic is the lifetime performance at high temperature. While the performance of PEDOT degrades at high temperature that of HIL 665 remains almost equivalent at 85 degrees Celsius compared to room temperature performance.

Figure 22A:
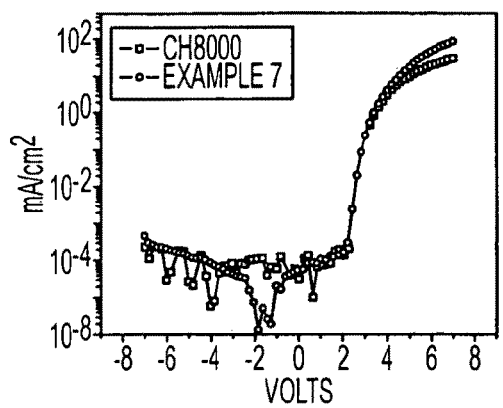
FIG. 22 illustrates current-voltage-luminance performance for SMOLED devices.
Figure 22B:
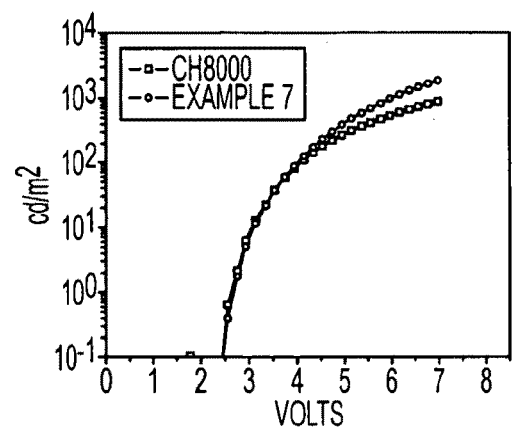
Figure 22C:
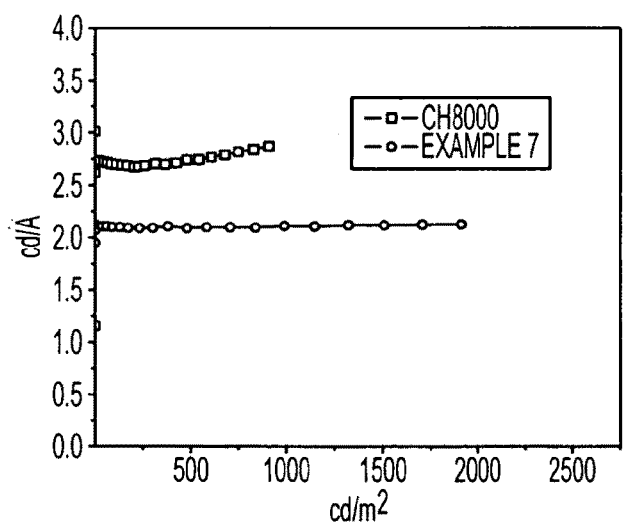

FIG. 22 illustrates current-voltage-luminance performance for SMOLED devices comparing CH8000 and Example 7. Improved operating voltage is obtained with some loss in efficiency.

Figure 23:
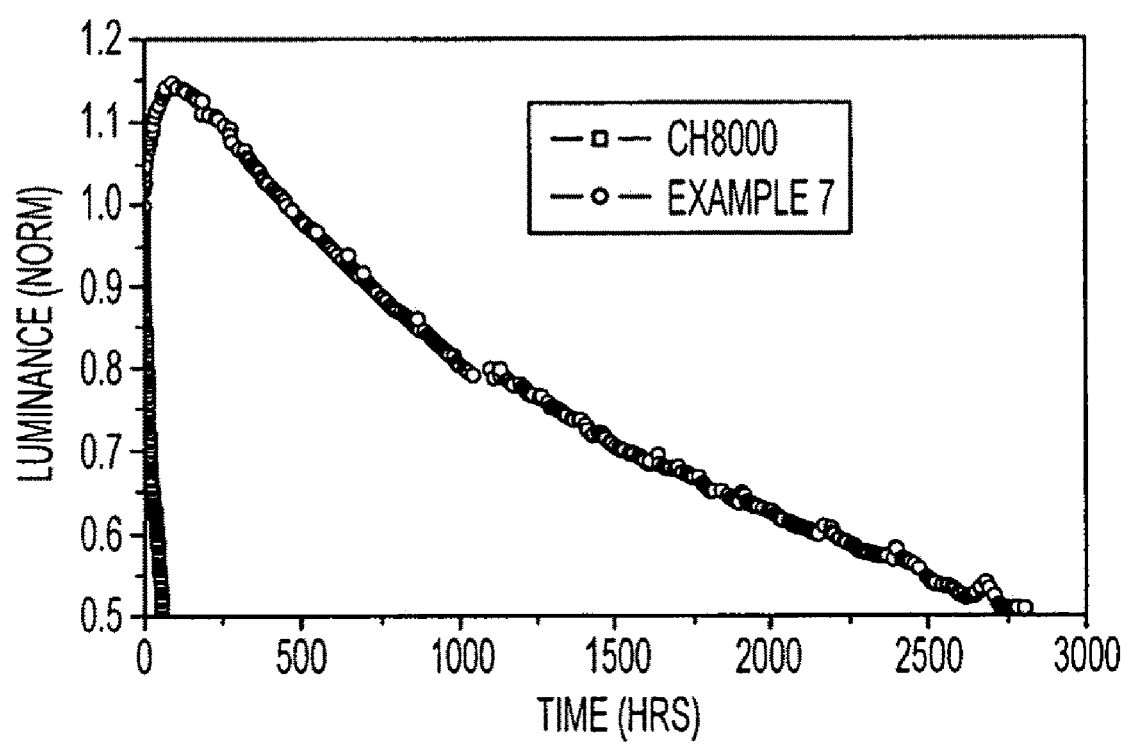
FIG. 23 illustrates comparison of luminance degradation for SMOLED devices.

FIG. 23 illustrates comparison of luminance degradation for SMOLED devices including CH8000 and Example 7 at an initial luminance of 1,000 nits under DC current at room temperature.

TABLE II

| | | Measured at 10 mA/cm2 | | |
| --- | --- | --- | --- | --- |
| HIL System | Emitter | Voltage (Volts) | Brightness (cd/m2) (lm/W) | Efficiency (Cd/A) |
| Baytron CH8000 | OC1C10 | 3.4 | 59 | 0.59 |
| Example 7 | OC1C10 | 3.5 | 38 | 0.38 |
| Example 8 | OC1C10 | 2.8 | 34 | 0.34 |
| Example 9 | OC1C10 | 2.6 | 20 | 0.20 |
| Example 10 | OC1C10 | 3.7 | 66 | 0.66 |
| Baytron CH8000 | Commercial emitter 1 | 4.2 | 712 | 7.1 |
| Example 7 | Commercial emitter 1 | 4.9 | 799 | 8.0 |
| Example 8 | Commercial emitter 1 | 4.3 | 817 | 8.2 |
| Example 9 | Commercial emitter 1 | 4.6 | 733 | 7.3 |
| Example 10 | Commercial emitter 1 | 5.0 | 822 | 8.2 |
| Baytron CH8000 | Commercial Emitter 2 | 3.8 | 1140 | 11.4 |
| Example 7 | Commercial Emitter 2 | 3.9 | 47 | 0.5 |
| Baytron CH8000 | Commercial Emitter 2 (with interlayer) | 3.4 | 1406 | 14.1 |
| Example 7 | Commercial Emitter 2 (with interlayer) | 3.6 | 1268 | 12.7 |
| Baytron CH8000 | SMOLED | 5.1 | 209 | 2.1 |
| Example 7 | SMOLED | 5.5 | 253 | 2.5 |
| Example 8 | SMOLED | 6.7 | 237 | 2.4 |
| Example 9 | SMOLED | 6.6 | 235 | 2.4 |
| Example 10 | SMOLED | 7.0 | 258 | 2.6 |

Working Example for ESD Coating Formulation

To a 20 mL vial was added a 0.57% aqueous sulfonated ICP solution (4.93 g) and the pH adjusted to neutral with dimethylethanolamine. To this solution was added DI water (3.78 g) and a polyurethane dispersion (0.84 g, Witcobond W-240) with constant agitation. Butyl cellosolve (5.45 g) was then added and the solution was stirred vigorously on a hotplate for 10 minutes at 75° C.

|  | % in solution | % in solids |
|---|---|---|
| Sulfonated polymer | 0.1875 | 10 |
| Witcobond 240 | 1.6875 | 90 |
| DMEA | 0.0154 |  |
| Water | 61.319 |  |
| Butyl Cellosolve | 36.791 |  |

What is claimed is:

1. A composition comprising:
a water soluble or water dispersible regioregular polythiophene comprising (i) at least one organic substituent, and (ii) at least one sulfonate substituent comprising sulfonate sulfur bonding directly to the polythiophene backbone,
wherein the polythiophene is a regioregular head-to-tail coupled poly(3-substituted thiophene) having a degree of regioregularity of at least about 70% apart from sulfonation.

2. The composition according to claim 1, wherein the sulfonate substituent is in acid form.

3. The composition according to claim 1, wherein the sulfonate substituent is in salt form comprising a counterion.

4. The composition according to claim 3, wherein the counterion is an ammonium counterion.

5. The composition according to claim 1, wherein the sulfonate substituent is in salt form comprising a counterion, wherein the counterion comprises organic groups.

6. The composition according to claim 1, wherein the sulfonate substituent is in salt form comprising a counterion, wherein the counterion comprises an organic cation and is free of metal.

7. The composition according to claim 1, wherein the sulfonate substituent is in salt form comprising a counterion, wherein the counterion comprises a metal cation.

8. The composition according to claim 1, wherein the polythiophene is a regioregular head-to-tail coupled poly(3-substituted thiophene) having a degree of regioregularity of at least about 90% apart from sulfonation.

9. The composition according to claim 1, wherein the polythiophene is a regioregular head to tail coupled poly(3-substituted thiophene) having a degree of regioregularity of at least about 98% apart from sulfonation.

10. The composition according to claim 1, wherein the polythiophene is water soluble.

11. The composition according to claim 1, wherein the polythiophene is doped.

12. The composition according to claim 1, wherein the organic substituent comprises at least one heteroatom.

13. The composition according to claim 1, wherein the organic substituent is an alkoxy or alkyl substituent.

14. The composition according to claim 1, wherein the polythiophene is an alternating copolymer.

15. The composition according to claim 1, wherein the polythiophene is prepared from a bithiophene monomer.

16. The composition according to claim 1, wherein the polythiophene is a homopolymer of a thiophene, a copolymer comprising thiophene units, or a block copolymer comprising at least one block of polythiophene.

17. The composition according to claim 1, wherein the water soluble or water dispersible regioregular polythiophene is in a crosslinked form.

18. The composition according to claim 1, wherein the polythiophene is characterized by an acid number of about 250 or less mg KOH/g polymer.

19. The composition according to claim 1, wherein the polythiophene is characterized by a degree of sulfonation of about 25% to about 75%.

20. The composition according to claim 1, wherein the polythiophene is characterized by a degree of sulfonation of about 50% to about 90%.

21. The composition according to claim 1, wherein polythiophene is water soluble, the polythiophene is a homopolymer, wherein the organic substituent is an alkoxy or alkyl substituent, and wherein the polythiophene has an acid number of about 50 to about 250 mg KOH/g polymer.

22. The composition according to claim 1, wherein the polythiophene is water soluble, and wherein the polythiophene is in salt form comprising a counterion, wherein the counterion comprises organic groups.

23. The composition according to claim 1, wherein the polythiophene is water soluble and is doped, wherein the polythiophene is a regioregular polythiophene having a degree of regioregularity of at least about 90%, and wherein the polythiophene is in acid form.

24. The composition according to claim 1, wherein the organic substituent comprises at least one alkylene glycol unit.

25. The composition according to claim 1, wherein the organic substituent comprises a plurality of alkylene glycol units.

26. The composition according to claim 1, wherein the organic substituent comprises at least one ethyleneoxy unit.

27. The composition according to claim 1, wherein the organic substituent comprises at least three oxygen atoms.

28. The composition according to claim 1, wherein the organic substituent comprises a methoxyethoxyethoxy unit.

29. The composition according to claim 1, wherein the polythiophene comprises a polymerized bithiophene monomer and the organic substituent comprises alkyleneoxy units.

30. The composition according to claim 1, wherein the polythiophene comprises a homopolymer and the organic substituent comprises alkyleneoxy units.

31. The composition according to claim 1, wherein the polythiophene is prepared by sulfonation of a polymer which is represented by formula (I) and the R group comprises at least two alkyleneoxy units:

$$\text{(I)}$$

32. A device comprising a layer comprising the composition according to claim 1.

33. The device according to claim 32, wherein the layer is a hole injection layer or a hole transport layer.

34. The device according to claim 32, wherein the device is an OLED device.

35. The device according to claim 32, wherein the device is a PLED device.

36. The device according to claim 32, wherein the device is a SMOLED device.

37. The device according to claim 32, wherein the device is a photovoltaic device.

38. The device according to claim 32, wherein the device comprises at least two electrodes and at least one light emitting or photoactive layer.

39. A device comprising the composition according to claim 1, wherein the device is a sensor, a supercapacitor, a cation transducer, a drug release device, an electrochromic device, a transistor, a field effect transistor, an electrode modifier, an electrode modifier for an organic field effect transistor, an actuator, or a transparent electrode.

40. A device comprising the composition according to claim 1, wherein the composition is a coating on an electrode.

41. A device comprising the composition according to claim 1, wherein the composition is a coating on a gold electrode.

42. The composition according to claim 1, wherein the composition is formulated in an aqueous solvent system optionally comprising at least one organic solvent.

43. The composition according to claim 42, wherein the aqueous solvent system comprises water and at least one water-miscible organic solvent.

44. The composition according to claim 43, wherein the water-miscible organic solvent is isopropanol, ethanol, methanol, a propylene glycol, or an ethylene glycol.

45. The composition according to claim 43, wherein the composition further comprises a synthetic polymer, wherein the synthetic polymer is non-conductive.

46. The composition according to claim 45, wherein the synthetic polymer is selected from the group comprising poly(styrene) or poly(styrene) derivatives, poly(vinyl acetate) or its derivatives, poly(ethylene glycol) or its derivatives, poly(ethylene-co-vinyl acetate), poly(pyrrolidone) or its derivatives, poly(vinyl pyridine) or its derivatives, poly(methyl methacrylate) or its derivatives, and poly(butyl acrylate) or its derivatives.

47. The composition according to claim 45, wherein the weight amount of the synthetic polymer is at least three times the amount of the heterocyclic polymer.

48. The composition according to claim 1, wherein the polythiophene has been neutralized with a pH neutralizing agent.

49. The composition according to claim 1, wherein the polythiophene has been neutralized with a pH neutralizing agent comprising a basic compound.

50. The composition according to claim 1, wherein the polythiophene has been neutralized with a pH neutralizing agent comprising an amine.

51. The composition according to claim 1, wherein the composition has a substantially neutral pH.

52. The composition according to claim 1, wherein the composition has a pH of 2.0 to 7.0.

53. The composition according to claim 1, wherein the composition is adapted for inkjet printing.

54. A coating composition comprising:
(A) water,
(B) a water soluble or water-dispersible regioregular polythiophene comprising (i) at least one organic substituent, and (ii) at least one sulfonate substituent comprising sulfonate sulfur bonding directly to the polythiophene backbone,
(C) a synthetic polymer different from (B),
wherein the polythiophene is a regioregular head-to-tail coupled poly(3-substituted thiophene) having a degree of regioregularity of at least about 70% apart from sulfonation.

55. The coating composition according to claim 24, further comprising an organic co-solvent.

56. The coating composition according to claim 54, further comprising an organic co-solvent, wherein the weight amount of water is greater than the weight amount of the organic co-solvent.

57. The coating composition according to claim 54, further comprising a second synthetic polymer different from (B) and (C).

58. The coating composition according to claim 54, wherein the synthetic polymer is a water-soluble polymer.

59. The coating composition according to claim 54, wherein the synthetic polymer has a carbon backbone with a polar functional group in the side group.

60. The coating composition according to claim 54, wherein the weight amount of the synthetic polymer (C) is at least three times the amount of the regioregular polythiophene (B).

61. The coating composition according to claim 54, wherein the weight amount of the synthetic polymer (C) is at least five times the amount of the regioregular polythiophene (B).

62. The coating composition according to claim 54, wherein the amount of the regioregular polythiophene polymer (B) is about 5 wt. % to about 25 wt. % with respect to the total amount of (B) and (C).

63. A coated substrate comprising: a solid surface, a coating disposed on the surface, wherein the coating comprises a composition comprising: a water soluble, water dispersible, or water swellable regioregular polythiophene comprising (i) at least one organic substituent, and (ii) at least one sulfonate substituent comprising sulfonate sulfur bonding directly to the polythiophene backbone, wherein the regioregular polythiophene has a degree of regioregularity of at least about 70% apart from sulfonation.

64. A coated substrate comprising: a water soluble, water-dispersible, or water swellable regioregular polythiophene comprising (i) at least one organic substituent, and (ii) at least one sulfonate substituent comprising sulfonate sulfur bonding directly to the polythiophene backbone, a synthetic polymer different from the regioregular polythiophene, wherein the polythiophene has a degree of regioregularity of at least about 90% apart from sulfonation.

65. A device comprising a hole injection layer or a hole transport layer, the layer comprising a sulfonated conducting polymer, wherein the conducting polymer is a regioregular polythiophene having at least one organic substituent and a degree of regioregularity of at least about 70% apart from sulfonation.

66. The device according to claim 65, wherein the degree of regioregularity is at least 90%.

67. The device according to claim 65, wherein the regioregular polythiophene has a side group comprising oxygen heteroatom.

68. The device according to claim 65, wherein is a regioregular polythiophene the layer further comprises at least one additional polymer.

69. A composition comprising:
a water soluble, water dispersible, or water swellable regioregular polythiophene comprising (i) at least one organic substituent, and (ii) at least one sulfonate substituent comprising sulfonate sulfur bonding directly to the polythiophene backbone, wherein the regioregular polythiophene has a degree of regioregularity of at least about 70% apart from sulfonation.

70. A composition comprising:
a water soluble or water dispersible polythiophene comprising (i) at least one organic substituent, and (ii) at least one sulfonate substituent comprising sulfonate sulfur bonding directly to the polythiophene backbone, wherein the polythiophene is a regioregular polythiophene and has a degree of regioregularity of at least about 90% and wherein the organic substituent comprises at least one heteroatom.

71. The composition according to claim 70, wherein the sulfonate substituent is in acid form.

72. The composition according to claim 70, wherein the sulfonate substituent is in salt form comprising a counterion.

73. The composition according to claim 72, wherein the counterion is an ammonium counterion.

74. The composition according to claim 70, wherein the sulfonate substituent is in salt form comprising a counterion, wherein the counterion comprises organic groups.

75. The composition according to claim 70, wherein the sulfonate substituent is in salt form comprising a counterion, wherein the counterion comprises an organic cation and is free of metal.

76. The composition according to claim 70, wherein the sulfonate substituent is in salt form comprising a counterion, wherein the counterion comprises a metal cation.

77. The composition according to claim 70, wherein the polythiophene is water soluble.

78. The composition according to claim 70, wherein the organic substituent comprises at least one oxygen heteroatom.

79. The composition according to claim 70, wherein the organic substituent is an alkoxy or alkyl substituent.

80. The composition according to claim 70, wherein the polythiophene is an alternating copolymer.

81. The composition according to claim 70, wherein the polythiophene has been neutralized with a pH neutralizing agent.

82. The composition according to claim 70, wherein the polythiophene has been neutralized with a pH neutralizing agent comprising a basic compound.

83. The composition according to claim 70, wherein the polythiophene has been neutralized with a pH neutralizing agent comprising an amine.

84. The composition according to claim 70, wherein the composition has a substantially neutral pH.

85. The composition according to claim 70, wherein the composition has a pH of 2.0 to 7.0.

86. A composition comprising:
a water soluble or water dispersible heterocyclic polymer comprising (i) at least one organic substituent, wherein the organic substituent comprises at least one oxygen heteroatom and (ii) at least one sulfonate substituent comprising sulfonate sulfur bonding directly to the heterocyclic polymer backbone, wherein the heterocyclic polymer is a regioregular bolythiophene which has a degree of regioregularity of at least about 70% and a molecular weight of 5,000 to about 1,000,000.

87. The composition according to claim 86, wherein the regioregular polythiophene has a degree of regioregularity of at least 85% and a molecular weight of about 15,000 to about 1,000,000.

88. The composition according to claim 86, wherein the regioregular polythiophene has a degree of regioregularity of at least 90%.

89. The composition according to claim 86, wherein the polymer comprises regioregular polythiophene having a degree of regioregularity of at least 95%.

90. The composition according to claim 86, wherein the polymer is a first polymer, and the composition further comprising at least one different second polymer.

91. The composition according to claim 86, wherein the polymer is a first polymer, and the composition further comprising at least one different second polymer, and at least one third polymer different from the first and second polymers.

92. The composition according to claim 86, wherein the organic substituent comprises alkyleneoxy units.

93. The composition according to claim 86, wherein polymer comprises regioregular polythiophene and the composition is formulated in an aqueous solvent system optionally comprising at least one organic solvent, and the organic substituent comprises alkyleneoxy units.

94. The composition according to claim 86, wherein the polymer comprises regioregular polythiophene, the degree of sulfonation is at least 30%, and the organic substituent comprises alkyleneoxy units.

95. A device comprising an electrostatic dissipation (ESD) material, said ESD material comprising at least one water soluble or water dispersible polymer comprising regioregular polythiophene comprising:
(i) at least one organic substituent; and
(ii) at least one sulfonate substituent comprising sulfonate sulfur bonding directly to the polythiophene backbone, wherein the polythiophene has a degree of regioregularity of at least about 70% apart from sulfonation.

96. The device of claim 95 wherein the ESD material further comprises at least one polymer which is not regioregular polythiophene.

97. The device of claim 95 wherein the number average molecular weight of the polymer comprising regioregular polythiophene is about 5,000 to about 50,000.

98. The device of claim 95 wherein the polymer comprising the regioregular polythiophene is a homopolymer.

99. The device of claim 95 wherein the polymer comprising the regioregular polythiophene is a copolymer.

100. The device of claim 95 wherein the regioregular polythiophene has a degree of regioregularity of at least 85%.

101. A method of reducing electrostatic charge on a device comprising coating said device with a coating comprising a polythiophene comprising:
(i) at least one organic substituent; and
(ii) at least one sulfonated substituent comprising sulfur bonding directly to the polythiophene backbone, wherein the polythiophene has a degree of regioregularity of at least about 70% apart from sulfonation.

102. The method of claim 101, wherein said coating further comprises at least one polymer which does not comprise polythiophene.

* * * * *